(12) United States Patent
Iwase et al.

(10) Patent No.: US 10,398,024 B2
(45) Date of Patent: *Aug. 27, 2019

(54) STRETCHABLE CIRCUIT BOARD AND METHOD FOR MANUFACTURING STRETCHABLE CIRCUIT BOARD

(71) Applicant: NIPPON MEKTRON, LTD., Tokyo (JP)

(72) Inventors: Masayuki Iwase, Tokyo (JP); Takeo Wakabayashi, Tokyo (JP); Eiji Mizuno, Sakado (JP)

(73) Assignee: NIPPON MEKTRON, LTD., Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 15/569,647

(22) PCT Filed: Jan. 30, 2017

(86) PCT No.: PCT/JP2017/003215
§ 371 (c)(1),
(2) Date: Oct. 26, 2017

(87) PCT Pub. No.: WO2017/183247
PCT Pub. Date: Oct. 26, 2017

(65) Prior Publication Data
US 2018/0116049 A1  Apr. 26, 2018

(30) Foreign Application Priority Data

Apr. 18, 2016 (JP) .................... 2016-083237

(51) Int. Cl.
*H01R 12/77* (2011.01)
*H05K 1/02* (2006.01)
(Continued)

(52) U.S. Cl.
CPC ........... *H05K 1/0281* (2013.01); *B32B 25/00* (2013.01); *B32B 27/00* (2013.01);
(Continued)

(58) Field of Classification Search
CPC ........... H05K 1/028; H05K 2201/0129; H05K 1/0283; H05K 3/0011; H05K 2203/065
See application file for complete search history.

(56) References Cited

U.S. PATENT DOCUMENTS 4,967,038 A  10/1990  Gevins et al.
5,413,659 A  5/1995  Koskenmaki et al.
(Continued)

FOREIGN PATENT DOCUMENTS

JP  S55-027269 Y2  6/1980
JP  2008-177259 A  7/2008
(Continued)

OTHER PUBLICATIONS

International Search Report dated Mar. 14, 2017, issued in PCT/JP2017/003215.
(Continued)

*Primary Examiner* — Xuong M Chung Trans
(74) *Attorney, Agent, or Firm* — Westerman, Hattori, Daniels & Adrian, LLP

(57) ABSTRACT

The stretchable circuit board (100) includes: a stretchable base (10); a stretchable wiring portion (20) formed on the stretchable base (10); a reinforcement base (30) having in-plane rigidity higher than that of the stretchable base (10); a draw-out wiring portion (40) formed on the reinforcement base (30), and electrically continuous with the stretchable wiring portion (20); and an elastomer layer (50) formed on the reinforcement base (30). The reinforcement base (30) overlaps with a partial area (10*a*) of the stretchable base (10). An other area (10*b*) of the stretchable base (10) is
(Continued)

exposed from the reinforcement base (30). The stretchable wiring portion (20) extends on the other area (10*b*) and over the partial area (10*a*). The elastomer layer (50) and the stretchable base (10) are layered and joined with each other.

15 Claims, 9 Drawing Sheets

(51) Int. Cl.
| | |
|---|---|
| H01R 12/70 | (2011.01) |
| H01R 43/20 | (2006.01) |
| H05K 3/00 | (2006.01) |
| B32B 25/00 | (2006.01) |
| B32B 27/00 | (2006.01) |
| H05K 1/03 | (2006.01) |
| H05K 1/14 | (2006.01) |
| H05K 3/28 | (2006.01) |
| H05K 3/36 | (2006.01) |

(52) U.S. Cl.
CPC ....... *H01R 12/7041* (2013.01); *H01R 12/771* (2013.01); *H01R 43/205* (2013.01); *H05K 1/0283* (2013.01); *H05K 1/03* (2013.01); *H05K 1/14* (2013.01); *H05K 3/0011* (2013.01); *H05K 3/28* (2013.01); *H05K 3/36* (2013.01); *H05K 2201/0129* (2013.01); *H05K 2201/0133* (2013.01); *H05K 2203/065* (2013.01); *H05K 2203/0759* (2013.01); *H05K 2203/0783* (2013.01)

(56) References Cited

U.S. PATENT DOCUMENTS

| | | | | |
|---|---|---|---|---|
| 7,326,463 | B2* | 2/2008 | Aisenbrey | B29C 45/0013 |
| | | | | 252/506 |
| 7,491,892 | B2* | 2/2009 | Wagner | H05K 1/0283 |
| | | | | 174/254 |
| 8,883,287 | B2* | 11/2014 | Boyce | B29C 59/02 |
| | | | | 174/254 |
| 9,018,532 | B2* | 4/2015 | Wesselmann | H05K 1/0283 |
| | | | | 174/117 F |
| 9,040,839 | B2 | 5/2015 | Furuta et al. | |
| 9,226,402 | B2 | 12/2015 | Hsu | |
| 9,408,305 | B2 | 8/2016 | Hsu | |
| 9,635,751 | B2 | 4/2017 | Yoshihara et al. | |
| 9,763,323 | B2* | 9/2017 | Iwase | H05K 1/0283 |
| 9,844,145 | B2 | 12/2017 | Hsu | |
| 9,961,766 | B2* | 5/2018 | Iwase | H05K 1/0283 |
| 2005/0106907 | A1 | 5/2005 | Yamada et al. | |
| 2006/0148285 | A1 | 7/2006 | Naoi | |
| 2008/0048698 | A1 | 2/2008 | Amemiya et al. | |
| 2009/0317639 | A1 | 12/2009 | Axisa et al. | |
| 2012/0026700 | A1* | 2/2012 | Furuta | H05K 3/361 |
| | | | | 361/750 |
| 2012/0314382 | A1 | 12/2012 | Wesselmann et al. | |
| 2014/0011390 | A1 | 1/2014 | Hasegawa et al. | |
| 2014/0124257 | A1 | 5/2014 | Yoshihara et al. | |
| 2014/0240932 | A1 | 8/2014 | Hsu | |
| 2015/0065840 | A1 | 3/2015 | Bailey | |
| 2015/0141784 | A1 | 5/2015 | Morun et al. | |
| 2015/0148641 | A1 | 5/2015 | Morun et al. | |
| 2015/0189753 | A1 | 7/2015 | Goyal et al. | |
| 2016/0081192 | A1 | 3/2016 | Hsu | |
| 2016/0105950 | A1 | 4/2016 | Drzaic et al. | |
| 2016/0227623 | A1 | 8/2016 | Yoo | |
| 2016/0309594 | A1 | 10/2016 | Hsu | |
| 2017/0034907 | A1 | 2/2017 | Iwase | |
| 2018/0070446 | A1 | 3/2018 | Takahashi et al. | |

FOREIGN PATENT DOCUMENTS

| | | |
|---|---|---|
| JP | 2012-33316 A | 2/2012 |
| JP | 2012-033597 A | 2/2012 |
| JP | 2012-33674 A | 2/2012 |
| JP | 2014-151617 A | 8/2014 |
| JP | 2014-162124 A | 9/2014 |
| JP | 2014-236103 A | 12/2014 |
| JP | 2016-509375 A | 3/2016 |
| JP | 2016-178121 A | 10/2016 |
| JP | 2017-34038 A | 2/2017 |
| JP | 2017-69530 A | 4/2017 |
| JP | 2017-152687 A | 8/2017 |
| WO | 2012/147412 A1 | 11/2012 |
| WO | 2013/105402 A1 | 7/2013 |

OTHER PUBLICATIONS

Decision to Grant a Patent dated Sep. 11, 2018, issued in counterpart Japanese Application No. 2016-083237, with English machine translation. (5 pages).

* cited by examiner

STRETCHABLE CIRCUIT BOARD AND METHOD FOR MANUFACTURING STRETCHABLE CIRCUIT BOARD

TECHNICAL FIELD

The present invention relates to stretchable circuit boards and methods for manufacturing a stretchable circuit board.

RELATED ART

In the wearable device market and the medical device market, biological sensors and biological information monitors have received much attention in recent years. For example, the sports industry has been trying to quantify body movements of competitors in a highly precise manner in order to help competitors improve their physical ability or skills. In such a case, wearable biological sensors that sense movement of a living body are used in some occasions. In addition, the medical industry has been trying to detect vital signs (biological information) such as electrocardiograms, heart rates, blood pressures, and body temperatures for the purpose of treatment of diseases or taking measures against presymptomatic diseases. In such a case, biological information monitors that sense biological information may be used. In general, these biological sensors or biological information monitors are provided on garments or equipment, and sensing or monitoring is performed in a state where these garments or equipment are worn.

However, as a human body moves, garments or equipment are slightly misaligned from a body. This causes a problem of misalignment of the biological sensor or the biological information monitor, which is provided on garments or equipment, from the targeted portion of a living body, resulting in a deterioration in sensing accuracy or monitoring accuracy.

The problem described above can be alleviated by attaching the biological sensor or the biological information monitor directly onto the human body. Thus, in recent years, study has been made on a technique called stretchable electronics using a stretchable circuit board. The stretchable circuit board has a base and wiring that can stretch in in-plane directions, and can stretch in association with movement of, for example, joints of a human body in a state where it is attached directly onto the human body.

Patent Document 1 describes a stretchable circuit board that includes a stretchable base and an electroconductive pattern containing electroconductive microparticles and elastomer and entirely has stretchability.

Furthermore, Patent Document 2 describes a stretchable circuit board. In this stretchable circuit board, an island composed of a material having Young's modulus higher than that of a stretchable base is formed into a thin membrane through a printing method, and is embedded in the stretchable base. In the stretchable circuit board described in Patent Document 2, the island has elements mounted thereon, and islands are connected with each other via stretchable wires.

RELATED DOCUMENT

Patent Document

Patent Document 1: Japanese Patent Application Laid-open No. 2014-236103

Patent Document 2: Japanese Patent Application Laid-open No. 2014-162124

SUMMARY OF THE INVENTION

Problem to be Solved by the Invention

With regards to creating the biological sensors or biological information monitors using the stretchable circuit board, the present inventors consider that it is preferable that external devices with high rigidity such as a control board are externally connected, rather than being mounted on the stretchable circuit board, in order to avoid restriction to movements of the target portion of the living body. Thus, the present inventors consider that it is preferable to configure the stretchable circuit board so as to be able to be easily connected with external devices.

However, in Patent Documents 1 and 2, no description is made as to the configuration that can achieve easy connection between the stretchable circuit board and external devices.

The present invention has been made in view of the problem described above, and provides a stretchable circuit board having a structure that can achieve easy connection between a stretchable circuit board and an external device, and also provide a method for manufacturing the stretchable circuit board.

Means for Solving the Problem

According to the present invention, there is provided a stretchable circuit board, including:

a stretchable base;

a stretchable wiring portion formed on at least one of a first main surface and a second main surface of the stretchable base;

a reinforcement base having in-plane rigidity higher than that of the stretchable base;

a draw-out wiring portion formed on at least one of a first main surface and a second main surface of the reinforcement base, and electrically continuous with the stretchable wiring portion; and an elastomer layer formed on at least one of the first main surface and the second main surface of the reinforcement base, in which the reinforcement base overlaps with a partial area of the stretchable base, an other area of the stretchable base is exposed from the reinforcement base, the stretchable wiring portion extends on the other area and over the partial area, and the elastomer layer and the stretchable base are layered and joined with each other.

Furthermore, according to the present invention, there is provided a stretchable circuit board, including:

a stretchable base having a stretchable wiring portion formed thereon; and a reinforcement base having a draw-out wiring portion formed thereon, the draw-out wiring portion being electrically continuous with the stretchable wiring portion, in which the reinforcement base overlaps with a partial area of the stretchable base, an other area of the stretchable base is exposed from the reinforcement base, the stretchable wiring portion extends from the other area over the partial area, and the partial area of the stretchable base has a thickness greater than the thickness of the other area of the stretchable base.

Furthermore, according to the present invention, there is provided a method for manufacturing a stretchable circuit board, including:

forming a draw-out wiring portion and an elastomer layer on a reinforcement base;

forming a stretchable wiring portion on a stretchable base; and applying heat and pressure to the reinforcement base and the stretchable base to thermally fuse the elastomer layer and the stretchable base.

Effect of the Invention

According to the present invention, it is possible to easily achieve connection between the stretchable circuit board and external devices.

Furthermore, according to the present invention, it is possible to manufacture a stretchable circuit board having a structure that can easily achieve connection with external devices.

BRIEF DESCRIPTION OF THE DRAWINGS

FIGS. 1A and 1B are sectional views of cut end faces, and FIG. 1C is a plan view.

FIG. 3A is a sectional view of a cut end face, and FIG. 3B is a plan view.

FIG. 5A is a sectional view of a cut end face, and FIG. 5B is a plan view.

DESCRIPTION OF THE EMBODIMENTS

Figure 1A:
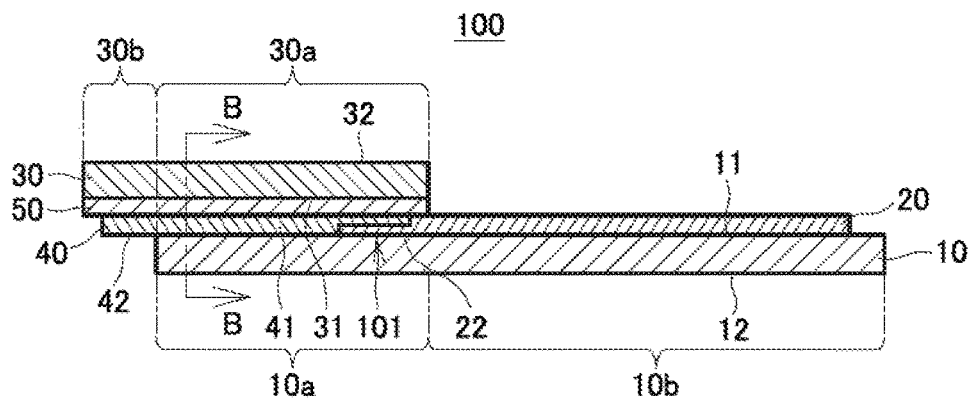
FIGS. 1A, 1B, and 1C are diagrams each illustrating a stretchable circuit board according to a first exemplary embodiment.

The object described above, other objects, features, and advantages will be made further clear by the preferred exemplary embodiments described below and the following drawings attached thereto.

Hereinbelow, exemplary embodiments according to the present invention will be described with reference to the drawings. Note that, in all of the drawings, the same reference characters are attached to similar constituent components, and detailed explanation thereof will not be repeated as appropriate.

First Exemplary Embodiment

First, a stretchable circuit board 100 according to a first exemplary embodiment will be described with reference to FIGS. 1, 1B, and 1C.

Figure 1B:
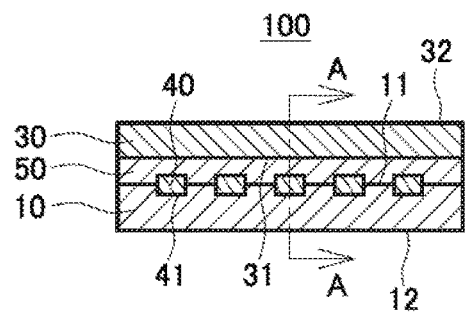
Figure 1C:
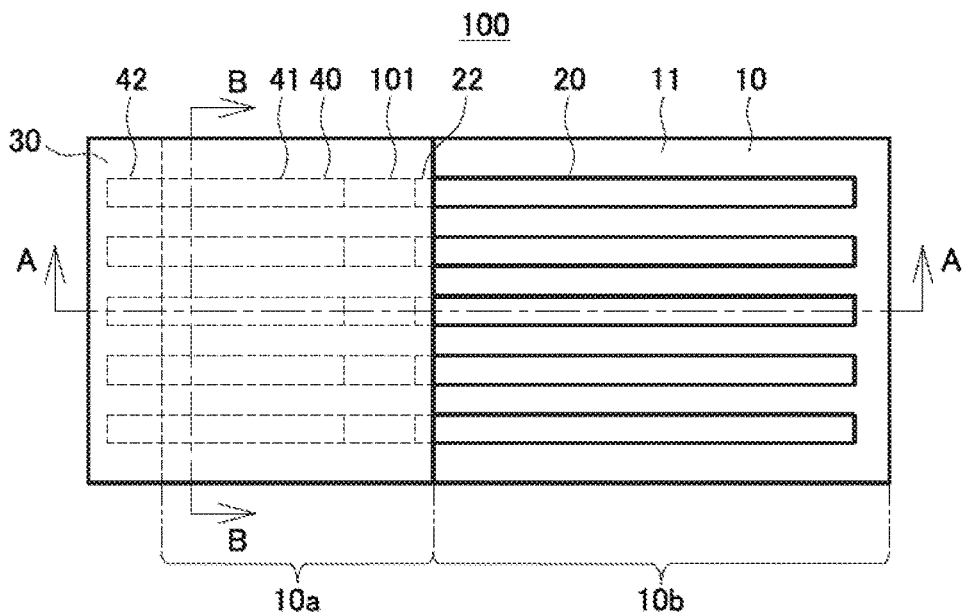

FIGS. 1A, 1B, and 1C are diagrams each illustrating the stretchable circuit board 100 according to the first exemplary embodiment. FIGS. 1A and 1B are sectional views of cut end faces obtained by cutting the stretchable circuit board 100 in the thickness direction, and FIG. 1C is a plan view thereof. Furthermore, FIG. 1A is a sectional view of a cut end face taken along the line A-A in FIGS. 1B and 1C, and FIG. 1B is a sectional view of a cut end face taken along the line B-B in FIGS. 1A and 1C.

The stretchable circuit board 100 according to the present exemplary embodiment includes: a stretchable base 10; a stretchable wiring portion 20 formed on at least one of a first main surface 11 and a second main surface 12 of the stretchable base 10; a reinforcement base 30 having in-plane rigidity higher than that of the stretchable base 10; a draw-out wiring portion 40 formed on at least one of a first main surface 31 and a second main surface 32 of the reinforcement base 30, and electrically continuous with the stretchable wiring portion 20; and an elastomer layer 50 formed on at least one of the first main surface 31 and the second main surface 32 of the reinforcement base 30. The reinforcement base 30 overlaps with a partial area 10a of the stretchable base 10. An other area 10b of the stretchable base 10 is exposed from the reinforcement base 30. The stretchable wiring portion 20 extends on the other area 10b and over the partial area 10a. The elastomer layer 50 and the stretchable base 10 are layered and joined with each other.

With the stretchable circuit board 100 configured as described above, the draw-out wiring portion 40 is formed, and hence, the stretchable circuit board 100 can be electrically connected with external devices (not illustrated) using this draw-out wiring portion 40. Here, since the draw-out wiring portion 40 is formed on the reinforcement base 30, it is possible to prevent the draw-out wiring portion 40 from deforming when the draw-out wiring portion 40 is connected with the external devices. Thus, it is possible to easily achieve connection between the stretchable circuit board 100 and external devices.

In addition, an elastomer layer 50 formed on one of the main surfaces of the reinforcement base 30 and the stretchable base 10 are layered and joined with each other. Thus, it is possible to significantly enhance the joining strength (adhesive strength) between the elastomer layer 50 and the stretchable base 10. Thus, it is possible to prevent occurrence of detachment of the stretchable base 10 and the elastomer layer 50 at the interface therebetween.

Below, the stretchable circuit board 100 will be described in more detail.

The stretchable base 10 is formed into a film shape (thin membrane shape), has flexibility and an electrically insulating property, and has stretchability in in-plane directions.

The stretchable base 10 may be a single layer structure or may be a multiple layer structure (structure having two or more layers).

The stretchable base 10 has two main surfaces (the first main surface 11 and the second main surface 12). In FIGS. 1A and 1B, the first main surface 11 is a surface on the upper side of the stretchable base 10, and the second main surface 12 is a surface on the lower side of the stretchable base 10.

The stretchable base 10 has a partial area 10a covered with the reinforcement base 30 and an other area 10b not covered with the reinforcement base 30 (exposed from the reinforcement base 30).

The stretchable wiring portion 20 has electrical conductivity, and has a function of transmitting electrical signals and electrical current.

The desired number of stretchable wiring portions 20 is formed on at least one of the first main surface 11 and the second main surface 12 of the stretchable base 10. In the case of the present exemplary embodiment, plural stretchable wiring portions 20 are formed on the first main surface 11 of the stretchable base 10.

There is no particular limitation as to the pattern shape of each of the stretchable wiring portions 20. In addition, the way that the stretchable wiring portions 20 extend may be any of a straight shape, a polygonal line shape, and a curved shape.

Each of the stretchable wiring portions 20 extends on the other area 10b of the stretchable base 10 and over the partial area 10a.

The reinforcement base 30 is formed into a film shape (thin membrane shape) or plate shape or thin plate shape. The reinforcement base 30 is formed into a plane shape that covers the partial area 10a of the stretchable base 10. There is no particular limitation as to the specific plane shape of the stretchable base 10.

As described above, the reinforcement base 30 has in-plane rigidity higher (greater) than that of the stretchable base 10. Here, the in-plane rigidity represents the product (E·I) of Young's modulus (E) and second moment (I) of area. Thus, the "reinforcement base 30 having in-plane rigidity higher than that of the stretchable base 10" does not necessarily mean that the Young's modulus, which is a property of material, of the reinforcement base 30 is greater than that of the stretchable base 10, and means that the reinforcement base 30 is more difficult to deform against bending loads as compared with the stretchable base 10. That is, for example, it includes a case where, due to the fact that the reinforcement base 30 has a thickness greater than that of the stretchable base 10, the reinforcement base 30 is more difficult to deform. Thus, the reinforcement base 30 may be made from the same material as the stretchable base 10. In addition, it also can be said that the reinforcement base 30 is more difficult to deform against the tensile stress in in-plane directions, as compared with the stretchable base 10.

It is preferable that the reinforcement base 30 has an electrically insulating property.

The reinforcement base 30 has two main surfaces (the first main surface 31 and the second main surface 32). In FIGS. 1A and 1B, the first main surface 31 is a surface on the lower side of the reinforcement base 30, and the second main surface 32 is a surface on the upper side of the reinforcement base 30.

The first main surface 31 of the reinforcement base 30 faces the first main surface 11 of the stretchable base 10. More specifically, the first main surface 31 of the reinforcement base 30 and the first main surface 11 of the stretchable base 10 are faced with each other with the elastomer layer 50 and the draw-out wiring portion 40 being disposed between these surfaces.

The reinforcement base 30 has a partial area 30a covered with the stretchable base 10 and an other area 30b not covered with the stretchable base 10 (exposed from the stretchable base 10).

The elastomer layer 50 is formed into a thin layered shape, and has an electrically insulating property.

The elastomer layer 50 may be a single layer structure or may be a multiple layer structure (structure having two or more layers).

As described above, the elastomer layer 50 is formed on at least one of the first main surface 31 and the second main surface 32 of the reinforcement base 30. In the case of the present exemplary embodiment, the elastomer layer 50 is formed on the first main surface 31 of the reinforcement base 30.

For example, as illustrated in FIG. 1A, the elastomer layer 50 is formed directly on the first main surface 31 of the reinforcement base 30.

Figure 9:
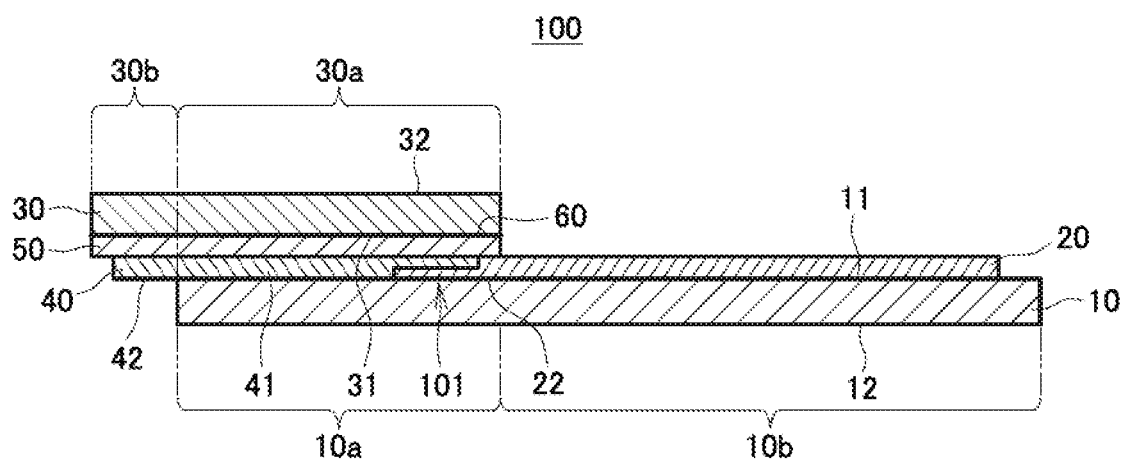
FIG. 9 is a sectional view of a cut end face of another example of the stretchable circuit board according to the first exemplary embodiment.

Alternatively, as illustrated in FIG. 9, the elastomer layer 50 may be formed on at least one of the first main surface 31 and the second main surface 32 of the reinforcement base 30 through an easy-adhesion coating layer 60. For example, as illustrated in FIG. 9, the easy-adhesion coating layer 60 may be formed on the first main surface 31 of the reinforcement base 30. In this case, the elastomer layer 50 is formed above the first main surface 31 of the reinforcement base 30 through the easy-adhesion coating layer 60.

It is preferable that the elastomer layer 50 entirely covers the first main surface 31.

The draw-out wiring portion 40 has electrical conductivity, and has a function of transmitting electrical signals and electrical current.

The desired number of draw-out wiring portions 40 is formed on at least one of the first main surface 31 and the second main surface 32 of the reinforcement base 30. In the case of the present exemplary embodiment, plural draw-out wiring portions 40 are formed on the first main surface 31 of the reinforcement base 30.

There is no particular limitation as to the pattern shape of each of the draw-out wiring portions 40. In addition, the way that the draw-out wiring portions 40 extend may be any of a straight shape, a polygonal line shape, and a curved shape.

Each of the draw-out wiring portions 40 extends on the other area 30b of the reinforcement base 30 and over the partial area 30a.

Thus, each of the draw-out wiring portions 40 is partially covered with the stretchable base 10 (with the partial area 10a of the stretchable base 10), and the other portion of each of the draw-out wiring portions 40 is not covered with the stretchable base 10 (exposed from the stretchable base 10).

Furthermore, each of stretchable wiring portion 20 is partially covered with the elastomer layer 50 and the reinforcement base 30 (the partial area 30a of the reinforcement base 30), and the other portion of each of the stretchable wiring portions 20 is not covered with the elastomer layer 50 and the reinforcement base 30 (exposed from the elastomer layer 50 and the reinforcement base 30).

In the case of the present exemplary embodiment, the elastomer layer 50 lies between the draw-out wiring portion 40 and the reinforcement base 30, and the draw-out wiring portion 40 is in contact with a surface on one side of the elastomer layer 50.

That is, the draw-out wiring portion 40 is formed on a surface (the lower surface of the elastomer layer 50 in FIG. 1A) located on the side opposite to the reinforcement base 30 side, of the elastomer layer 50.

With the configuration as described above, it is possible to achieve favorable integrity of the draw-out wiring portion 40 to the reinforcement base 30. That is, rather than the draw-out wiring portion 40 being formed directly on the reinforcement base 30, the draw-out wiring portion 40 is formed above the reinforcement base 30 through the elastomer layer 50, and hence, it is possible to form the draw-out wiring portion 40 so as to have a favorable adhesion property with respect to the elastomer layer 50 that is a foundation layer.

The elastomer layer 50 and the stretchable base 10 are layered with each other, and the surface, located on the stretchable base 10 side (the surface located on the side opposite to the reinforcement base 30 side), of the elastomer layer 50 and the first main surface 11 of the stretchable base 10 are joined with each other.

More specifically, the elastomer layer 50 and the stretchable base 10 are separated from each other by the stretchable wiring portion 20 or the draw-out wiring portion 40 in a portion where the stretchable wiring portion 20 or the draw-out wiring portion 40 lies between the elastomer layer 50 and the stretchable base 10, while the elastomer layer 50 and the stretchable base 10 are surface-joined with each other in the other portion (see FIG. 1B).

Both of the stretchable wiring portion 20 and the draw-out wiring portion 40 are disposed on the same layer.

Each of the draw-out wiring portions 40 corresponds to the stretchable wiring portion 20 on a one-to-one basis, and is joined with a corresponding stretchable wiring portion 20, thereby being electrically continuous with the corresponding stretchable wiring portion 20.

More specifically, the draw-out wiring portion 40 and the stretchable wiring portion 20 partially overlap with each other, and at the overlapping portion, the draw-out wiring portion 40 and the stretchable wiring portion 20 are in contact with and electrically continuous with each other. The portion where the draw-out wiring portion 40 and the stretchable wiring portion 20 overlap and is in contact with each other is referred to as a connecting portion 101. That is, the connecting portion 101 is configured by joining together one end portion of the draw-out wiring portion 40 and one end portion of a stretchable wiring portion 20 corresponding to this draw-out wiring portion 40.

The connecting portion 101 lies between the stretchable base 10 and a set of the reinforcement base 30 and the elastomer layer 50, and is not exposed to the external surface of the stretchable circuit board 100.

The end portion (the other end portion), opposite to the connecting portion 101, of the draw-out wiring portion 40 is exposed to the external surface of the stretchable circuit board 100, and forms an external terminal 42.

In addition, at least a part of the other end side of the stretchable wiring portion 20 is exposed to the external surface of the stretchable circuit board 100, and forms a terminal.

Here, the portion of the stretchable wiring portion 20 located on the partial area 10a of the stretchable base 10 is disposed between the stretchable base 10 and the elastomer layer 50, and the entire periphery of this portion is surrounded by the elastomer layer 50 or the stretchable base 10.

In other words, the portion of the stretchable wiring portion 20 located on the partial area 10a of the stretchable base 10 is a buried portion 22, which is formed in a manner such that the entire periphery of this portion around the longitudinal axis thereof is wrapped by the elastomer layer 50 or the stretchable base 10.

With the configuration as described above, it is possible to stably hold the buried portion 22 of the stretchable wiring portion 20 between the elastomer layer 50 and the stretchable base 10, and hence, it is possible to prevent occurrence of troubles or change in electric properties caused by detachment of the stretchable wiring portion 20.

Furthermore, the connecting portion 101 between the stretchable wiring portion 20 and the draw-out wiring portion 40 is disposed between the stretchable base 10 and the elastomer layer 50, and the entire periphery of this connecting portion 101 is surrounded by the elastomer layer 50 or the stretchable base 10. That is, the connecting portion 101 is also wrapped by the elastomer layer 50 or the stretchable base 10.

With the configuration as described above, it is possible to stably hold the connecting portion 101 between the elastomer layer 50 and the stretchable base 10, and hence, it is possible to prevent poor connection at the connecting portion 101, and to prevent occurrence of troubles or change in electric properties caused by detachment of the connecting portion 101 from the elastomer layer 50 or the stretchable base 10.

Furthermore, a portion of the draw-out wiring portion 40 located on the partial area 30a of the reinforcement base 30 is disposed between the stretchable base 10 and the elastomer layer 50, and the entire periphery of this portion is surrounded by the elastomer layer 50 or the stretchable base 10.

In other words, the portion of the draw-out wiring portion 40 located on the partial area 10a of the stretchable base 10 is a buried portion 41, which is formed in a manner such that the entire periphery of this portion around the longitudinal axis thereof is wrapped by the elastomer layer 50 or the stretchable base 10.

With the configuration as described above, it is possible to stably hold the draw-out wiring portion 40 between the elastomer layer 50 and the stretchable base 10, and hence, it is possible to prevent occurrence of troubles or change in electric properties caused by detachment of the draw-out wiring portion 40.

Here, the elastomer layer 50 and the stretchable base 10 are thermally fused with each other. For this reason, it is likely that the interface substantially does not exist between the elastomer layer 50 and the stretchable base 10. In this case, the portion where the stretchable base 10 and the elastomer layer 50 are joined may be regarded as an integrated stretchable base. In addition, the thickness of the portion of this stretchable base where the elastomer layer 50 and the stretchable base 10 overlap with each other is greater than that of the other portion.

Thus, the stretchable circuit board 100 according to the present exemplary embodiment can also be defined in the following manner.

That is, the stretchable circuit board 100 includes: the stretchable base having the stretchable wiring portion 20 formed thereon; and the reinforcement base 30 having the draw-out wiring portion 40 formed thereon, the draw-out wiring portion 40 being electrically continuous with the stretchable wiring portion 20. The reinforcement base 30 overlaps with the partial area 10a of the stretchable base. The other area 10b of the stretchable base is exposed from the reinforcement base 30. The stretchable wiring portion 20 extends from the other area 10b over the partial area 10a, and the partial area 10a of the stretchable base has a thickness greater than that of the other area 10b of the stretchable base.

Here, the reinforcement base 30 is provided with a connector (not illustrated). In order to make the connector have sufficient stiffness, a reinforcing film (reinforcing member) having a predetermined thickness is laminated on the surface, located on the side opposite to the connector terminal, of the reinforcement base 30. In this case, the reinforcement base 30 largely bends and deforms when the connector is handled or is inserted/detached to an external device. In view of such a situation, the stretchable base has a greater thickness in an area (that is, in the partial area 10a) where the reinforcement base 30 is disposed, and hence, when the connector largely bends and deforms, this bending is less likely to have an effect on the surface (the second main surface 12), located on the side opposite to the reinforcement base 30 side, of the stretchable base. That is, even when the connector largely bends and deforms, it is possible to reduce the amount of deformation of the lower surface (the second main surface 12) of the stretchable base.

Furthermore, in the case where the portion where the stretchable base 10 and the elastomer layer 50 are joined with each other is formed as the integrated stretchable base (without interface), the buried portion 22 is formed in a manner such that the entire periphery thereof around the longitudinal axis thereof is wrapped by this stretchable base. In addition, the connecting portion 101 is also wrapped by this stretchable base. Moreover, the entire periphery of the buried portion 41 around the longitudinal axis thereof is also wrapped by this stretchable base.

In the stretchable circuit board 100, an area corresponding to the other area 10b of the stretchable base 10 is a stretchable area that can easily stretch in in-plane directions, while an area corresponding to the partial area 10a of the stretchable base 10 is a reinforcement area having in-plane rigidity higher than that of the stretchable area.

Of the stretchable area and the reinforcement area of the stretchable circuit board 100 as described above, the stretchable area is mainly affixed on a living body and flexibly follows movements of the living body or skin, while the reinforcement area has a function of achieving mechanical connection or electrical connection with an external device, not illustrated, in a simplified and highly reliable manner.

Next, the method for manufacturing the stretchable circuit board according to the first exemplary embodiment will be described with reference to FIGS. 2A, 2B, 2C, 2D, and 2E.

FIGS. 2A to 2E are process diagrams each illustrating a step for manufacturing the stretchable circuit board according to the first exemplary embodiment. Furthermore, FIGS. 2A to 2E are sectional views of cut end faces obtained at a position corresponding to the cutting position in FIG. 1A.

Figure 2A:
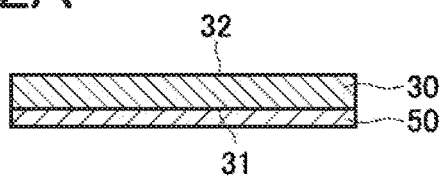
FIGS. 2A, 2B, 2C, 2D, and 2E are process diagrams each illustrating a step for manufacturing the stretchable circuit board according to the first exemplary embodiment.

First, as illustrated in FIG. 2A, the reinforcement base 30 is prepared, and the elastomer layer 50 and the draw-out wiring portion 40 are formed on the reinforcement base 30.

That is, a coating agent in which thermoplastic elastomer is dispersed in a solvent is first applied on one main surface (the first main surface 31) of the reinforcement base 30, and this solvent is volatilized to dry the coating agent, whereby the elastomer layer 50 is formed on the first main surface 31. It is preferable that the elastomer layer 50 is formed so as to entirely cover the first main surface 31.

Figure 2B:
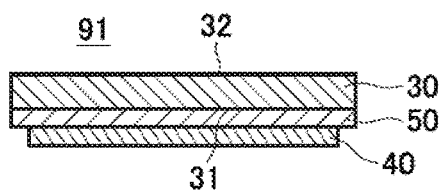

Next, as illustrated in FIG. 2B, the draw-out wiring portion 40 is formed on a surface, located on the side opposite to the reinforcement base 30 side, of the elastomer layer 50. Furthermore, the draw-out wiring portion 40 is formed so as to partially cover the elastomer layer 50. That is, not all the elastomer layer 50 is covered with the draw-out wiring portion 40.

As described above, the step of forming the draw-out wiring portion 40 and the elastomer layer 50 on the reinforcement base 30 includes: a step of applying, on the reinforcement base 30, the coating agent obtained by dispersing the thermoplastic elastomer in the solvent, and volatilizing the solvent to dry the coating agent, thereby forming the elastomer layer 50; and a step of forming the draw-out wiring portion 40 on the elastomer layer 50.

Here, since the elastomer layer 50 is made by applying and drying the coating agent (ink), the elastomer layer 50 is formed in a porous shape (due to the solvent being removed). Thus, when the draw-out wiring portion 40 is formed on the elastomer layer 50, the solvent of the electrically conductive paste used for forming the draw-out wiring portion 40 (formed, for example, through silkscreen printing) easily penetrates into the porous elastomer layer 50. This enables the draw-out wiring portion 40 to have favorable resolution in printing, and also enables the draw-out wiring portion 40 to have a favorable adhesion property with respect to the elastomer layer 50. Furthermore, this also enables the elastomer layer 50 to have a favorable adhesion property with respect to the reinforcement base 30.

Through the steps described above, a first layered body 91 including the reinforcement base 30, the elastomer layer 50, and the draw-out wiring portion 40 is manufactured.

Figure 2C:
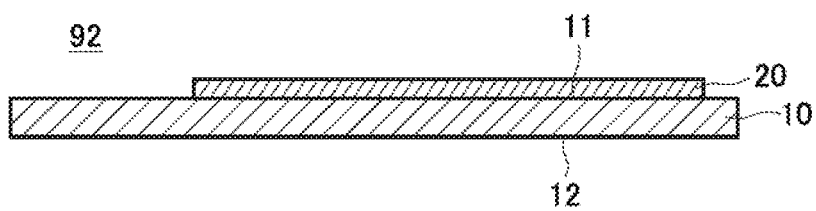

Furthermore, while the first layered body 91 is made, a second layered body 92 illustrated in FIG. 2C is made.

That is, the stretchable base 10 is prepared, and the stretchable wiring portion 20 is formed on one main surface (the first main surface 11) of the stretchable base 10. The stretchable wiring portion 20 is formed so as to partially cover the first main surface 11 of the stretchable base 10. That is, not all the first main surface 11 is covered with the stretchable wiring portion 20.

Through the processes described above, a second layered body 92 including the stretchable base 10 and the stretchable wiring portion 20 is made.

As for the order in which the first layered body 91 and the second layered body 92 are made, either may be made first, or the first layered body 91 and the second layered body 92 may be made in parallel.

Figure 2D:
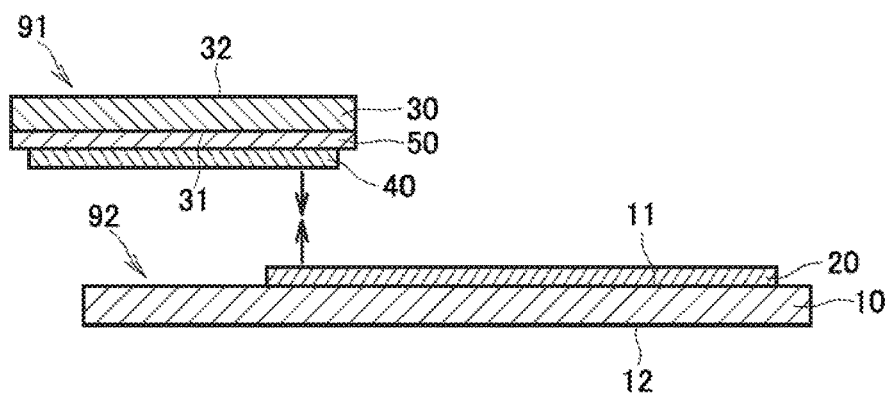
Figure 2E:
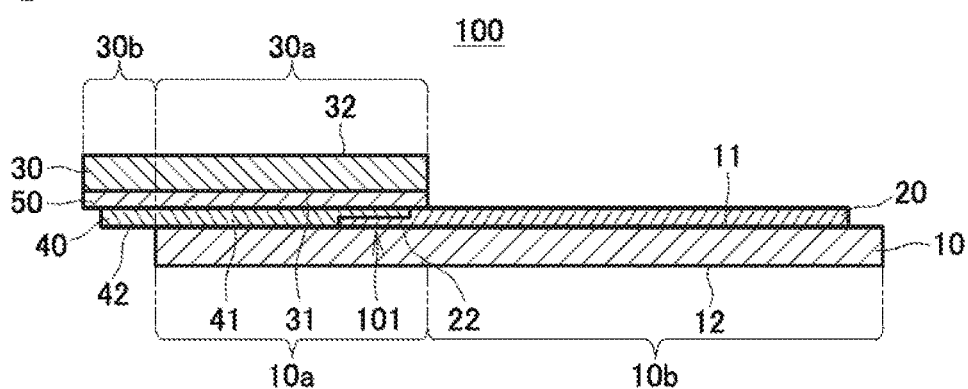

Next, the first layered body 91 and the second layered body 92 are aligned with each other and are layered, and the first layered body 91 and the second layered body 92 are joined with each other. That is, the first layered body 91 and the second layered body 92 are thermally compressed (application of heat and pressure) to thermally fuse the elastomer layer 50 and the stretchable base 10 with each other. In addition, at this time, one end portion of the stretchable wiring portion 20 and one end portion of the draw-out wiring portion 40 are thermally compressed with each other to form the connecting portion 101 (FIGS. 2D to 2E).

Through these steps, it is possible to manufacture the stretchable circuit board 100.

As described above, the method for manufacturing a stretchable circuit board according to the present exemplary embodiment includes: the step of forming the draw-out wiring portion 40 and the elastomer layer 50 on the reinforcement base 30; the step of forming the stretchable wiring portion 20 on the stretchable base 10; and the step of applying heat and pressure to the reinforcement base 30 and the stretchable base 10 to thermally fuse the elastomer layer 50 and the stretchable base 10.

Below, each constituent element of the stretchable circuit board 100 will be described in detail.

<Stretchable Base>

(Material)

A thermoplastic elastomer may be used as a material for the stretchable base 10. This elastomer includes, for example, silicone rubber, fluorocarbon rubber, urethane rubber, and ethylene rubber.

It is preferable that the elastomer used as the material for the stretchable base 10 has high flexibility to the extent that it can provide the stretchable base 10 with sufficient stretchability.

There is no particular limitation as to the stretchability of the stretchable base 10. However, the stretchability thereof is preferably equal to or more than 200% (twice or more times the stretchability in the tensile direction), and is more preferably equal to or more than 500% (five or more times the stretchability in the same direction).

It is preferable that the stretchable base 10 has a characteristic in which the solvent contained in the electrically conductive paste used for forming the stretchable wiring portion 20 easily penetrates into or is easily absorbed into. With this configuration, it is possible to achieve favorable resolution when the stretchable wiring portion 20 is formed through printing.

Preferably, the stretchable base 10 is a porous body. This enables the stretchable base 10 to have favorable moisture permeability, and enables the solvent to easily penetrate into and be absorbed into the stretchable base 10.

(Thickness)

There is no particular limitation as to the thickness of the stretchable base 10. However, in order to achieve more favorable flexibility of the stretchable base 10, the thickness of the stretchable base 10 is set preferably to equal to or less than 100 μm, more preferably to equal to or less than 25 μm, and still more preferably to equal to or less than 10 μm.

It is preferable that the thickness of the stretchable base 10 is equal to or more than 3 μm from the viewpoint of easiness in manufacturing.

In addition, in order to favorably hold the stretchable wiring portion 20 with the stretchable base 10, the thickness of the stretchable base 10 may be greater than that of the stretchable wiring portion 20.

(Moisture Permeability)

There is no particular limitation as to the moisture permeability (degree of moisture permeability) of the stretchable base 10. The degree of moisture permeability represents an index indicating the degree of moisture that passes through, and can be expressed as the amount of water (g) that passes through in per unit of time (24 hours) in a unit of area (one square meter). The degree of moisture permeability can be obtained as a value measured under conditions of 40 degrees and 90% RH of Testing Methods for Determination of the Water Vapour Transmission Rate (Dish Method) specified in JIS Z 0208. For example, the moisture permeability (degree of moisture permeability) is set preferably to equal to or more than $(1000 \text{ g/m}^2)/24$ h, more preferably to equal to or more than $(2000 \text{ g/m}^2)/24$ h. In the case where the stretchable circuit board 100 is used in a manner such that it is attached on a living body such as a human body having the skin from which sweating occurs, such favorable moisture permeability of the stretchable base 10 makes it possible to reduce the accumulation of evaporating moisture caused by sweating.

(Workability)

By subjecting the stretchable base 10 to pressure application processes, for example, at 80° C. or higher, the stretchable base 10 is softened to develop a fusing property, so that the adhesion property with the other member can be obtained. Thus, it is possible to adhere the stretchable base 10 to other members (mainly to the elastomer layer 50 in this exemplary embodiment) even if adhesive or the like is not used when the stretchable circuit board 100 is manufactured.

<Stretchable Wiring Portion>

(Material)

The stretchable wiring portion 20 is formed on the stretchable base 10 through patterning of a predetermined electroconductive paste. More specifically, after the electroconductive paste is patterned (for example, after printing), heat is applied to volatilize the solvent contained in the electroconductive paste and dry this electroconductive paste, whereby the stretchable wiring portion 20 can be formed.

The electroconductive paste used for forming the stretchable wiring portion 20 is formed by using a resin component as a binder and mixing it with an electrically conductive filler. It is preferable to use, as the resin component, one having reduced glass transformation temperature and reduced elastic modulus.

For the binder, typically, thermoplastic one is used.

There is no particular limitation as to the electrically conductive filler. However, typically, silver (Ag) is used, and for other materials, copper (Cu) or carbon or other components may be used.

There is no particular limitation as to methods for patterning of the electroconductive paste. However, preferably, screen printing or the like may be used.

(Thickness)

There is no particular limitation as to the thickness of the stretchable wiring portion 20. However, from the viewpoint of achieving favorable electrical conductivity of the stretchable wiring portion 20, the thickness of the stretchable wiring portion 20 is set preferably to equal to or more than 10 μm, more preferably to approximately 15 μm.

In addition, it is preferable to set the thickness of the stretchable wiring portion 20 to equal to or less than 50 μm from the working surface in the case where pattering is performed through printing. This makes it possible to form wirings while achieving stable processing.

(Electrical Property at the Time of Stretching)

It is preferable that the stretchable wiring portion 20 has electrical properties to the extent that it can work as wiring in terms of electrical conductivity when the stretchable wiring portion 20 stretches 1.5 times longer than the initial length (the length when the stretchable wiring portion 20 is not stretched).

The initial length of the stretchable wiring portion 20 is the length of the stretchable wiring portion 20 in a state where no tensile force acts on the stretchable circuit board 100 and the stretchable circuit board 100 remains flat.

<Reinforcement Base>

(Material)

There is no particular limitation as to the material for the reinforcement base 30. However, it may be possible to preferably use, for example, polyethylene terephthalate (PET), polyimide (PI), or the like.

(Thickness)

There is no particular limitation as to the thickness of the reinforcement base 30. However, the thickness of the reinforcement base 30 is set preferably to equal to or less than 100 μm, more preferably to equal to or less than 75 μm.

The reinforcement base 30 serves as a base of a connector cable that is to be fitted into a connector component provided on an external device that is a connection target for the stretchable circuit board 100. In this case, by setting the thickness of the reinforcement base 30 as described above, it is possible to make the reinforcement base 30 provide appropriate rigidity (stiffness) when the connector cable is fitted into the connector. It is preferable that the reinforcement base 30 has a thickness of equal to or more than 3 μm. In addition, it is preferable that the thickness of the reinforcement base 30 is greater than that of the stretchable base 10.

(Additional Process)

In order to achieve favorable adhesiveness between the elastomer layer 50 and the reinforcement base 30 when the elastomer layer 50 is formed as a film on the reinforcement base 30, it is preferable that the main surface (at least one of the first main surface 31 and the second main surface 32; the first main surface 31 in this exemplary embodiment) of the reinforcement base 30, which is to have the elastomer layer 50 formed thereon, is subjected to easy-adhesion processing in advance.

The easy-adhesion processing includes, for example, corona treatment (preferable, for example, in the case where the reinforcement base 30 is made out of PET), plasma treatment (preferable, for example, in the case where the reinforcement base 30 is made out of PI), and formation of an easy-adhesion coating layer 60 (FIG. 9).

In the case where the easy-adhesion coating layer 60 is formed as the foundation layer for the elastomer layer 50 as illustrated in FIG. 9, it is preferable that the easy-adhesion coating layer 60 also has moisture permeability so that the solvent contained in the electrically conductive paste used for forming the draw-out wiring portion 40 can easily penetrate into the elastomer layer 50 through the easy-adhesion coating layer 60. The easy-adhesion coating layer 60 can be formed, for example, by applying an adhesive on the reinforcement base 30 and drying it. It is preferable that the adhesive forming the easy-adhesion coating layer 60 is thermoplastic one.

In addition, other easy-adhesion processing includes mechanically or chemically coarsening the main surface of the reinforcement base 30 (applying coarsening processing).

<Elastomer Layer>

(Material)

A thermoplastic elastomer may be used as a material for the elastomer layer 50. This elastomer includes, for example, silicone rubber, fluorocarbon rubber, methane rubber, and ethylene rubber. The elastomer may be either thermosetting one or thermoplastic one.

It is preferable that the elastomer layer 50 has a characteristic in which the solvent contained in the electrically conductive paste used for forming the draw-out wiring portion 40 easily penetrates into or is easily absorbed into. With this configuration, it is possible to achieve favorable resolution when the draw-out wiring portion 40 is formed through printing, and also possible to achieve favorable adhesiveness of the draw-out wiring portion 40 with the elastomer layer 50.

Preferably, the elastomer layer 50 is a porous body. This enables the solvent to easily penetrate into and be absorbed into the elastomer layer 50.

The elastomer layer 50 may be made from, for example, the same type of material as that for the stretchable base 10.

The elastomer layer 50 is formed as a film by uniformly applying the material of the elastomer layer 50 in a liquid state onto the main surface of the reinforcement base 30.

In the case where the elastomer layer 50 has a structure having two or more layers, at least the layer closest to the reinforcement base 30 is formed as a film by applying the material of this layer in the liquid state onto the main surface of the reinforcement base 30 in a uniform manner, while the other layer or layers may be formed through layering using, for example, thermocompression.

(Moisture Permeability)

There is no particular limitation as to the moisture permeability (degree of moisture permeability) of the elastomer layer 50. However, the moisture permeability thereof is set preferably to equal to or more than (1000 $g/m^2$)/24 h, more preferably to equal to or more than (2000 $g/m^2$)/24 h. With the elastomer layer 50 having the favorable moisture permeability as described above, the solvent contained in the electrically conductive paste used for forming the draw-out wiring portion 40 easily penetrates into the elastomer layer 50, whereby it is possible to achieve favorable resolution in the case where the draw-out wiring portion 40 is formed through printing.

(Workability)

By subjecting the elastomer layer 50 to pressure application processes, for example, at 80° C. or higher, the elastomer layer 50 is softened to develop a fusing property, so that the adhesion property with the other member can be obtained. Thus, it is possible to adhere the elastomer layer 50 to other members (mainly to the stretchable base 10 in this exemplary embodiment) even if adhesive or the like is not used when the stretchable circuit board 100 is manufactured.

In particular, by making the elastomer layer 50 from the same type of material as that for the stretchable base 10, it is possible to achieve a significantly favorable joining property between the elastomer layer 50 and the stretchable base 10.

(Thickness)

There is no particular limitation as to the thickness of the elastomer layer 50. However, the thickness of the elastomer layer 50 is set preferably to equal to or less than 50 μm, more preferably to equal to or less than 25 μm, and still more preferably to equal to or less than 10 μm.

In the case where the reinforcement base 30 serves as the base of the connector cable as described above, the elastomer layer 50, together with the reinforcement base 30, serves as the base of the connector cable. In this case, by setting the thickness of the elastomer layer 50 as described above, it is possible to reduce an unnecessary increase in the thickness of the base of the connector cable while maintaining the rigidity (stiffness) as the base of the connector cable.

Meanwhile, it is preferable that the elastomer layer 50 has a thickness of equal to or more than 3 μm in order to achieve a favorable joining property between the elastomer layer 50 and the reinforcement base 30.

It is preferable that the thickness of the elastomer layer 50 is less than that of the stretchable base 10. With this configuration, it is possible to prevent the draw-out wiring portion 40 and the stretchable wiring portion 20 from unintentionally subducting (subducting with respect to the elastomer layer 50) when the thermocompression is applied to the elastomer layer 50 and the stretchable base 10 with the draw-out wiring portion 40 and the stretchable wiring portion 20 being disposed therebetween. As a result, it is possible to easily maintain the draw-out wiring portion 40 and the stretchable wiring portion 20 on the same layer, and also possible to achieve a sufficient joining strength between the draw-out wiring portion 40 and the stretchable wiring portion 20 at the connecting portion 101.

Here, one standard for the connector includes a thickness of 300 μm±30 μm. In view of this standard, if the draw-out wiring portion 40 and the stretchable wiring portion 20 subducted by more than 30 μm with respect to the elastomer layer 50, it results in nonconformance. Thus, by setting the thickness of the elastomer layer 50, for example, to equal to or less than 50 μm, it is possible to prevent the connector from failing to meet the standard.

<Draw-Out Wiring Portion>

(Material)

The draw-out wiring portion 40 is formed on the reinforcement base 30 through patterning of a predetermined electroconductive paste. More specifically, after the electroconductive paste is patterned (for example, after printing), heat is applied to volatilize the solvent contained in the electroconductive paste and dry this electroconductive paste, whereby the draw-out wiring portion 40 can be formed.

The electroconductive paste used for forming the draw-out wiring portion 40 is formed by using a resin component as a binder and mixing it with an electrically conductive filler. It is preferable to use, as the resin component, one having reduced glass transformation temperature and reduced elastic modulus.

For the binder, typically, thermoplastic one is used.

There is no particular limitation as to the electrically conductive filler. However, typically, silver (Ag) is used, and for other materials, copper (Cu) or carbon or other components may be used.

There is no particular limitation as to methods for patterning of the electroconductive paste. However, preferably, screen printing or the like may be used.

The draw-out wiring portion 40 may be made from the same type of material as that for the stretchable wiring portion 20, or may be made from a general, thermosetting, electrically conductive paste.

(Thickness)

There is no particular limitation as to the thickness of the draw-out wiring portion 40. However, from the viewpoint of achieving favorable electrical conductivity of the draw-out wiring portion 40, the thickness of the draw-out wiring portion 40 is set preferably to equal to or more than 10 μm, more preferably to approximately 15 μm.

In addition, from the viewpoint of workability in the case where pattering is performed through printing, it is preferable to set the thickness of the draw-out wiring portion 40 to equal to or less than 50 μm. This makes it possible to form wirings while achieving stable processing.

(Features Concerning Configuration)

The draw-out wiring portion 40 and the stretchable wiring portion 20 are integrally fused with each other at the connecting portion 101 through thermocompression.

In the case where the stretchable circuit board 100 is connected with an external device, a portion of the stretchable circuit board 100 containing the external terminal 42 is fitted into a connector component of the external device. Thus, it is preferable that the external terminal 42 is formed using a carbon paste having favorable wear resistance.

Second Exemplary Embodiment

Next, a stretchable circuit board 100 according to a second exemplary embodiment will be described with reference to FIGS. 3A and 3B.

Figure 3A:
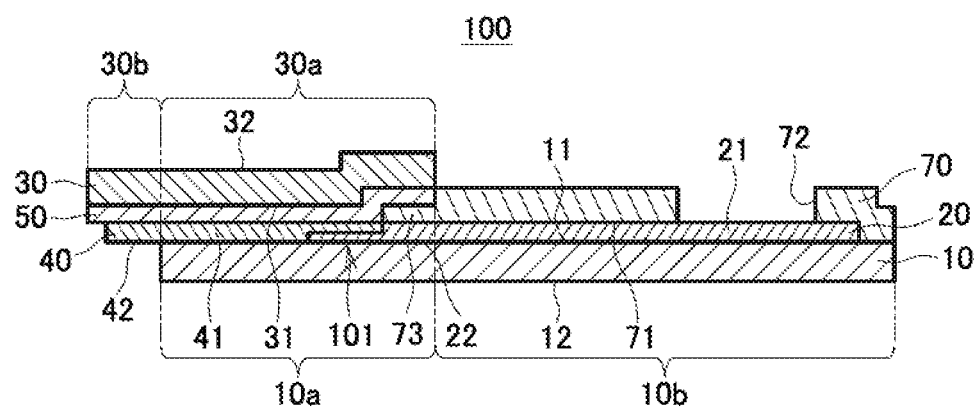
FIGS. 3A and 3B are diagrams each illustrating a stretchable circuit board according to a second exemplary embodiment.
Figure 3B:
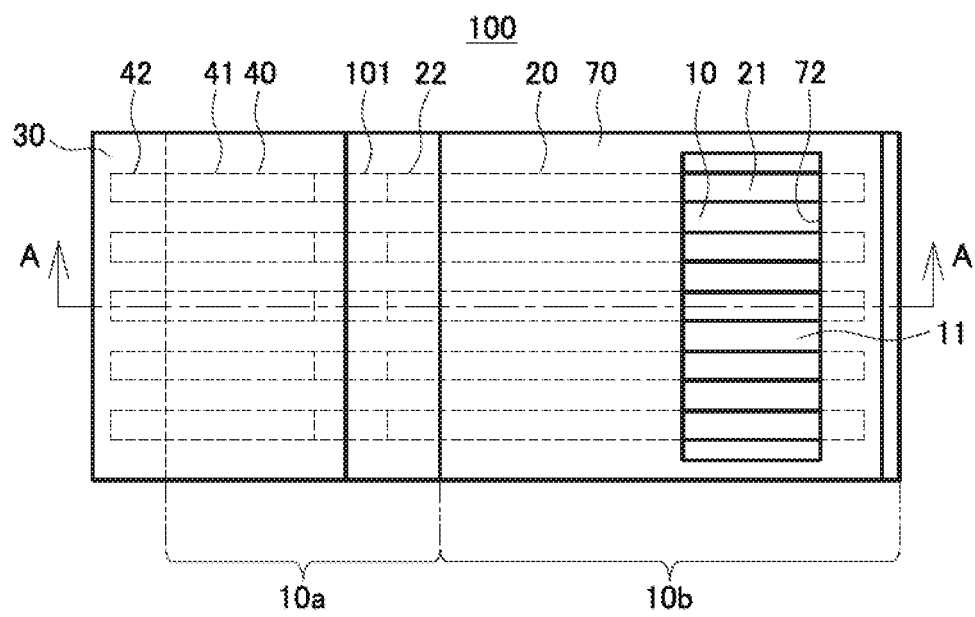

FIGS. 3A and 3B are diagrams each illustrating the stretchable circuit board 100 according to the second exemplary embodiment. FIG. 3A is a sectional view of a cut end face obtained by cutting the stretchable circuit board 100 in the thickness direction, and FIG. 3B is a plan view thereof. Furthermore, FIG. 3A is a sectional view of a cut end face taken along the line A-A in FIG. 3B.

In the points described below, the stretchable circuit board 100 according to the present exemplary embodiment is different from the stretchable circuit board 100 according to the first exemplary embodiment described above, while, in other points, it has a configuration similar to that of the stretchable circuit board 100 according to the first exemplary embodiment.

The stretchable circuit board 100 according to the present exemplary embodiment includes a stretchable cover base 70 in addition to the configuration of the stretchable circuit board 100 according to the first exemplary embodiment.

The stretchable cover base 70 is formed into a film shape (thin membrane shape), has flexibility and an electrically insulating property, and has stretchability in in-plane directions.

The stretchable cover base 70 may be a single layer structure or may be a multiple layer structure (structure having two or more layers).

One surface 71 (the lower surface of the stretchable cover base 70 in FIG. 3A) of the stretchable cover base 70 is joined with the first main surface 11 (with an area of the first main surface 11 where the stretchable wiring portion 20 is not formed) of the stretchable base 10 in the other area 10*b*. With this configuration, the portion of the stretchable wiring portion 20 on the other area 10*b* is covered with the stretchable cover base 70.

The stretchable cover base 70 has an opening 72 that exposes a part (the terminal portion 21) of the portion of each of the stretchable wiring portions 20 located on the other area 10*b*. The terminal portion 21 of each of the stretchable wiring portions 20 is exposed to the external surface of the stretchable circuit board 100 through the opening 72.

A common opening 72 may be formed in the stretchable cover base 70 for plural terminal portions 21 as illustrated in FIG. 3B as an example, or an individual opening 72 may be formed in the stretchable cover base 70 for each terminal portion 21.

Of the portion of each of the stretchable wiring portions 20 located on the other area 10*b*, a portion thereof other than the terminal portion 21 is covered with the stretchable cover base 70, and hence, is protected by the stretchable cover base 70.

One end portion 73 of the stretchable cover base 70 is disposed between the stretchable base 10 and the elastomer layer 50. More specifically, one surface (the lower surface of the one end portion 73 in FIG. 3A) of the one end portion 73 of the stretchable cover base 70 is joined with the first main surface 11 of the stretchable base 10, and the other surface (the upper surface in FIG. 3A) of the one end portion 73 is joined with the first main surface 31 of the reinforcement base 30.

As described above, the stretchable circuit board 100 according to the present exemplary embodiment includes: the elastomer layer 50 formed on the first main surface 31 of the reinforcement base 30; the draw-out wiring portion 40 formed on the first main surface 31 of the reinforcement base 30 through the elastomer layer 50; the stretchable wiring portion 20 formed on the first main surface 11 of the stretchable base 10; and the stretchable cover base 70. Furthermore, the first main surface 31 of the reinforcement base 30 and the first main surface 11 of the stretchable base 10 are faced with each other with the elastomer layer 50 and the draw-out wiring portion 40 being disposed between these surfaces, and the elastomer layer 50 and the first main surface 11 of the stretchable base 10 are joined with each other. In addition, the one surface 71 of the stretchable cover base 70 is joined with the first main surface 11 of the stretchable base 10 in the other area 10*b*. The stretchable cover base 70 has the opening 72 that partially exposes the stretchable wiring portions 20 located on the other area 10*b*. Moreover, the one end portion 73 of the stretchable cover base 70 is disposed between the elastomer layer 50 and the stretchable base 10.

Since the one end portion 73 of the stretchable cover base 70 is disposed between the elastomer layer 50 and the stretchable base 10, it is possible to favorably prevent detachment of the stretchable cover base 70 from the stretchable base 10 and also prevent detachment of the stretchable cover base 70 from the elastomer layer 50. Thus, it is possible to prevent detachment of the stretchable cover base 70 when the stretchable circuit board 100 stretches.

In addition, it may be possible that the interface between the stretchable cover base 70 and the elastomer layer 50 and the interface between the stretchable cover base 70 and the stretchable base 10 substantially do not exist, and the stretchable cover base 70 and the elastomer layer 50 are integrated into one. In this case, the portion where the stretchable base 10, the stretchable cover base 70, and the elastomer layer 50 are joined may be regarded as an integrated stretchable base.

Figure 4A:
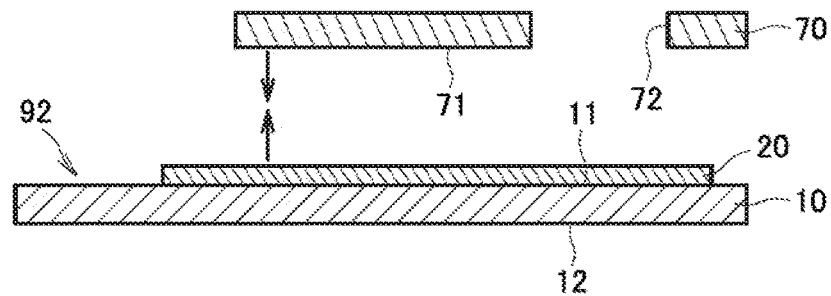
FIGS. 4A, 4B, 4C, and 4D are process diagrams each illustrating a step for manufacturing the stretchable circuit board according to the second exemplary embodiment.

Next, the method for manufacturing the stretchable circuit board according to the present exemplary embodiment will be described with reference to FIGS. 4A, 4B. 4C, and 4D.

First, while the stretchable cover base 70 having the opening 72 formed therein is prepared, a second layered body 92 similar to that in the first exemplary embodiment is prepared. Then, the stretchable cover base 70 and the second layered body 92 are aligned and layered with each other, and are joined with each other. That is, the stretchable cover base 70 and the second layered body 92 are thermally compressed (application of heat and pressure) to thermally fuse the stretchable cover base 70 and the stretchable base 10 with each other (FIGS. 4A to 4B).

Figure 4B:
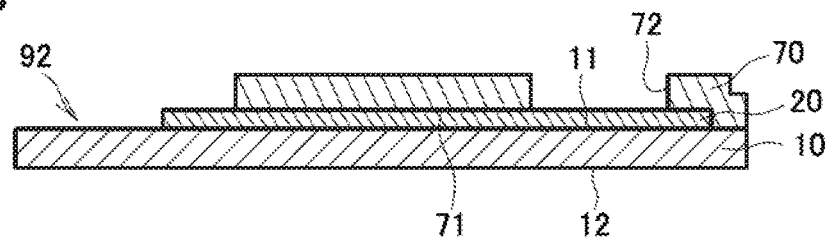
Figure 4C:
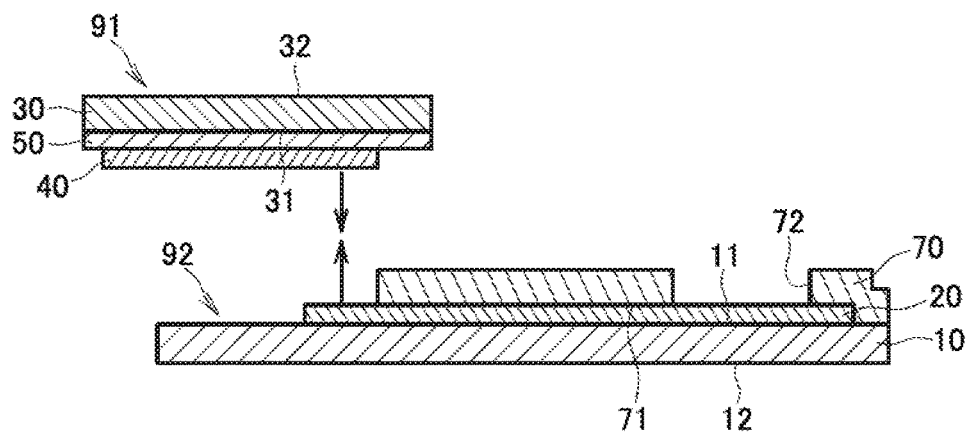
Figure 4D:
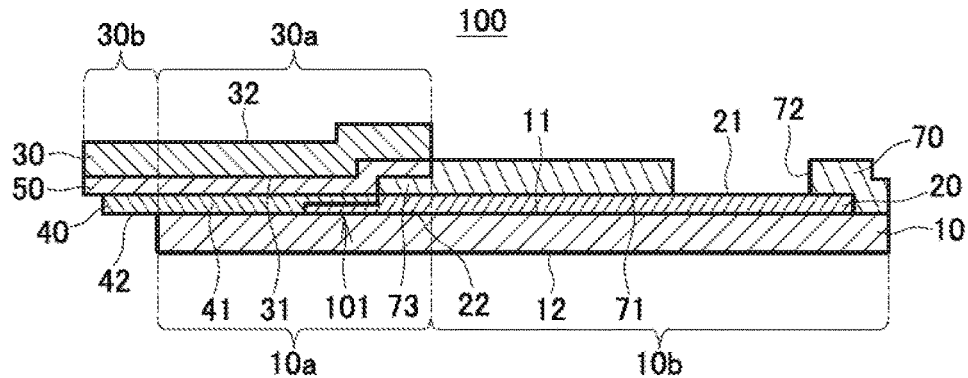

Further, the first layered body 91 similar to that in the first exemplary embodiment is prepared, and this first layered body 91 and the layered body obtained through the step in FIG. 4B are aligned and layered with each other, and are joined with each other. That is, by thermally compressing (application of heat and pressure) the first layered body 91 and the layered body obtained through the step in FIG. 4B, the elastomer layer 50 and the stretchable base 10 are thermally fused with each other, and the elastomer layer 50 and the one end portion 73 of the stretchable cover base 70 are thermally fused with each other. In addition, at this time, one end portion of the stretchable wiring portion 20 and one end portion of the draw-out wiring portion 40 are thermally compressed with each other to form the connecting portion 101 (FIGS. 4C to 4D).

Through these steps, it is possible to manufacture the stretchable circuit board 100 according to the present exemplary embodiment.

<Stretchable Cover Base>

Below, the stretchable cover base will be described in more detail.

(Material)

A thermoplastic elastomer may be used as a material for the stretchable cover base 70. This elastomer includes, for example, silicone rubber, fluorocarbon rubber, urethane rubber, and ethylene rubber.

It is preferable that the elastomer used as the material for the stretchable cover base 70 has high flexibility to the extent that it can provide the stretchable cover base 70 with sufficient stretchability.

There is no particular limitation as to the stretchability of the stretchable cover base 70. However, the stretchability thereof is preferably equal to or more than 200% (twice or more times the stretchability in the tensile direction), and is more preferably equal to or more than 500% (five or more times the stretchability in the same direction).

Preferably, the stretchable cover base 70 is a porous body. This enables the stretchable cover base 70 to have favorable moisture permeability.

It is preferable that the stretchable cover base 70 is made from the same type of material as that for the stretchable base 10.

(Thickness)

There is no particular limitation as to the thickness of the stretchable cover base 70. However, in order to achieve more favorable flexibility of the stretchable cover base 70, the thickness of the stretchable cover base 70 is set preferably to equal to or less than 100 µm, more preferably to equal to or less than 25 µm, and still more preferably to equal to or less than 10 µm.

From the viewpoint of easiness in manufacturing, it is preferable that the thickness of the stretchable cover base 70 is equal to or more than 3 µm.

In addition, in order to favorably cover the stretchable wiring portion 20 with the stretchable cover base 70, the thickness of the stretchable cover base 70 may be greater than that of the stretchable wiring portion 20.

(Moisture Permeability)

There is no particular limitation as to the moisture permeability (degree of moisture permeability) of the stretchable cover base 70. However, the moisture permeability thereof is set, for example, preferably to equal to or more than $(1000 \text{ g/m}^2)/24$ h, more preferably to equal to or more than $(2000 \text{ g/m}^2)/24$ h. In the case where the stretchable circuit board 100 is used in a manner such that it is attached on a living body such as a human body having the skin from which sweating occurs, such a favorable moisture permeability of the stretchable cover base 70 makes it possible to reduce the accumulation of evaporating moisture caused, for example, by sweating.

(Workability)

By subjecting the stretchable cover base 70 to pressure application processes, for example, at 80° C. or higher, the stretchable cover base 70 is softened to develop a fusing property, so that the adhesion property with the other member can be obtained. Thus, it is possible to adhere the stretchable cover base 70 to other members (mainly to the stretchable base 10 and the elastomer layer 50 in this exemplary embodiment) even if adhesive or the like is not used when the stretchable circuit board 100 is manufactured.

Third Exemplary Embodiment

Next, a stretchable circuit board 100 according to a third exemplary embodiment will be described with reference to FIGS. 5A and 5B.

Figure 5A:
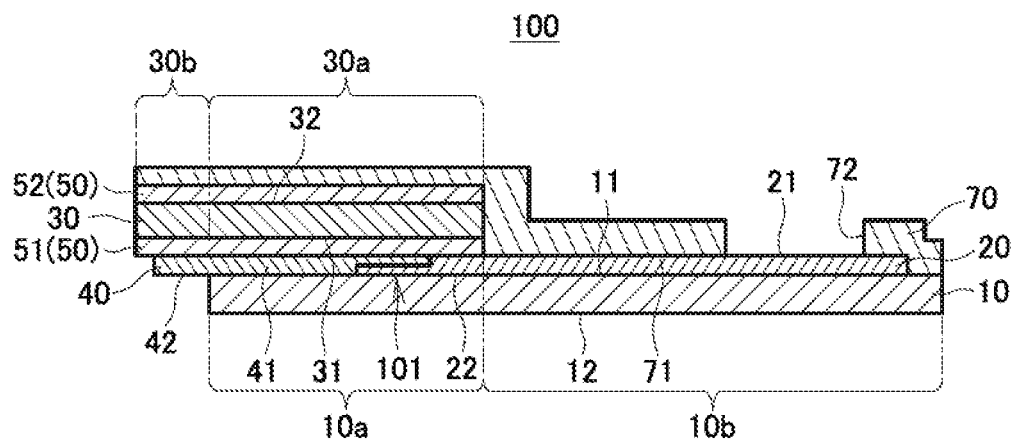
FIGS. 5A and 5B are diagrams each illustrating a stretchable circuit board according to a third exemplary embodiment.
Figure 5B:
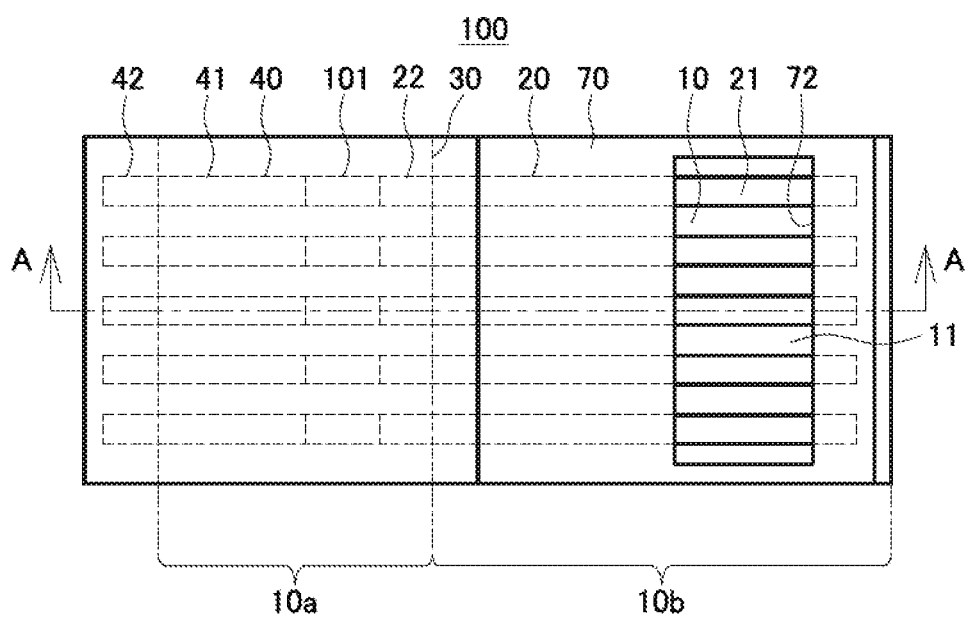

FIGS. 5A and 5B are diagrams each illustrating the stretchable circuit board 100 according to the third exemplary embodiment. FIG. 5A is a sectional view of a cut end face obtained by cutting the stretchable circuit board 100 in the thickness direction, and FIG. 5B is a plan view thereof. Furthermore, FIG. 5A is a sectional view of a cut end face taken along the line A-A in FIG. 5B.

In the points described below, the stretchable circuit board 100 according to the present exemplary embodiment is different from the stretchable circuit board 100 according to the first exemplary embodiment described above, while, in other points, it has a configuration similar to that of the stretchable circuit board 100 according to the first exemplary embodiment.

In the case of the present exemplary embodiment, the stretchable circuit board 100 is provided with an elastomer layer 50 (hereinafter, a second elastomer layer 52) formed on the second main surface 32 of the reinforcement base 30.

In the present exemplary embodiment, the elastomer layer 50 formed on the first main surface 31 of the reinforcement base 30 is referred to as a first elastomer layer 51.

The stretchable circuit board 100 according to the present exemplary embodiment includes a stretchable cover base 70 similar to that in the second exemplary embodiment.

In the case of this exemplary embodiment, the one surface 71 (the lower surface of the one surface 71 in FIG. 5A) of the stretchable cover base 70 is joined with the first main surface 11 of the stretchable base 10 in the other area 10b and the second elastomer layer 52. That is, the stretchable cover base 70 covers the other area 10b of the stretchable base 10 and the reinforcement base 30.

Thus, in this exemplary embodiment, the portion of the stretchable wiring portion 20 on the other area 10b is covered with the stretchable cover base 70, as in the second exemplary embodiment.

As described above, the stretchable circuit board 100 according the present exemplary embodiment includes: the first elastomer layer 51 formed on the first main surface 31 of the reinforcement base 30; the second elastomer layer 52 formed on the second main surface 32 of the reinforcement base 30; the draw-out wiring portion 40 formed on the first main surface 31 of the reinforcement base 30 through the first elastomer layer 51; the stretchable wiring portion 20 formed on the first main surface 31 of the stretchable base 10; and the stretchable cover base 70.

Furthermore, the first main surface 31 of the reinforcement base 30 and the first main surface 11 of the stretchable base 10 are faced with each other with the first elastomer layer 51 and the draw-out wiring portion 40 being disposed between these surfaces, and the first elastomer layer 51 and the first main surface 11 of the stretchable base 10 are joined with each other.

The one surface 71 of the stretchable cover base 70 is joined with the second elastomer layer 52 and the first main surface 11 of the stretchable base 10 in the other area 10b.

Furthermore, the stretchable cover base 70 has the opening 72 that partially exposes the stretchable wiring portions 20 (that is, the terminal portion 21) located on the other area 10b.

The stretchable cover base 70 is joined not only with the stretchable base 10 but also with the second elastomer layer 52 on the reinforcement base 30, and hence, it is possible to prevent the stretchable cover base 70 from detaching.

Next, the method for manufacturing the stretchable circuit board according to the present exemplary embodiment will be described with reference to FIGS. 6A, 6B, 6C, and 6D.

First, the first layered body 91 and the second layered body 92 are prepared. In the present exemplary embodiment, the first layered body 91 differs from that in the first and second exemplary embodiments in that the first layered body 91 in the present exemplary embodiment has the second elastomer layer 52 formed on the second main surface 32 of the reinforcement base 30.

As for the method for forming the second elastomer layer 52 on the second main surface 32 of the reinforcement base 30, it is possible to employ a method of joining the second elastomer layer 52, which has been formed as a film in advance, with the second main surface 32 through a laminate method (thermal pressing). The elastomer layer 50 (first elastomer layer 51) is formed on the first main surface 31 by using the method described in the first exemplary embodiment after the second elastomer layer 52 is joined with the second main surface 32.

Figure 6A:
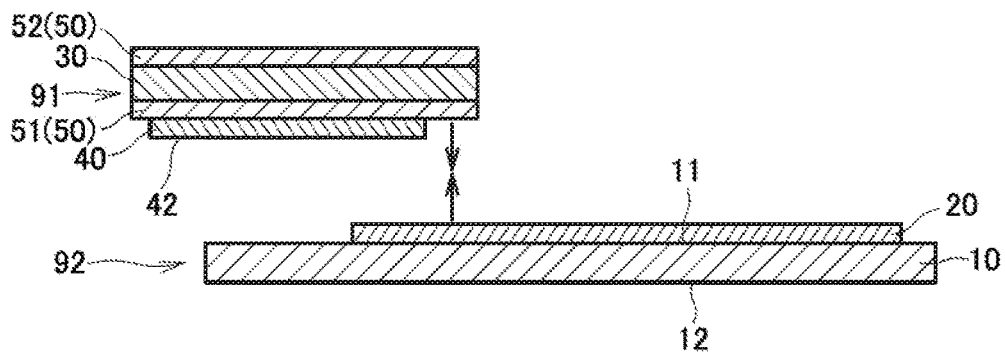
FIGS. 6A, 6B, 6C, and 6D are process diagrams each illustrating a step for manufacturing the stretchable circuit board according to the third exemplary embodiment.

Next, the first layered body 91 and the second layered body 92 are aligned with each other and are layered, and then, these bodies are joined with each other. That is, the first layered body 91 and the second layered body 92 are thermally compressed (application of heat and pressure) to thermally fuse the first elastomer layer 51 and the stretchable base 10 with each other. At this time, one end portion of the stretchable wiring portion 20 and one end portion of the draw-out wiring portion 40 are thermally compressed with each other to form the connecting portion 101 (FIGS. 6A to 6B).

Figure 6B:
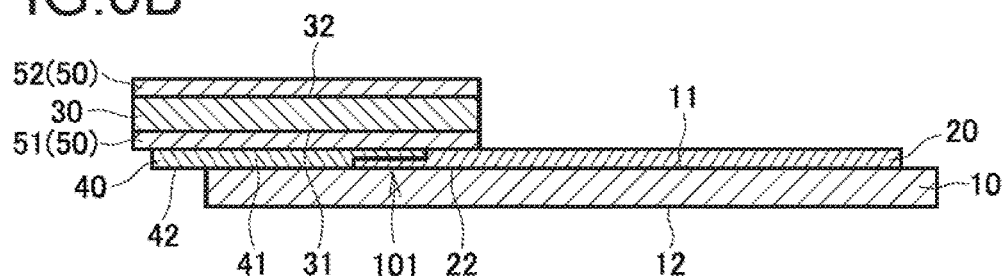
Figure 6C:
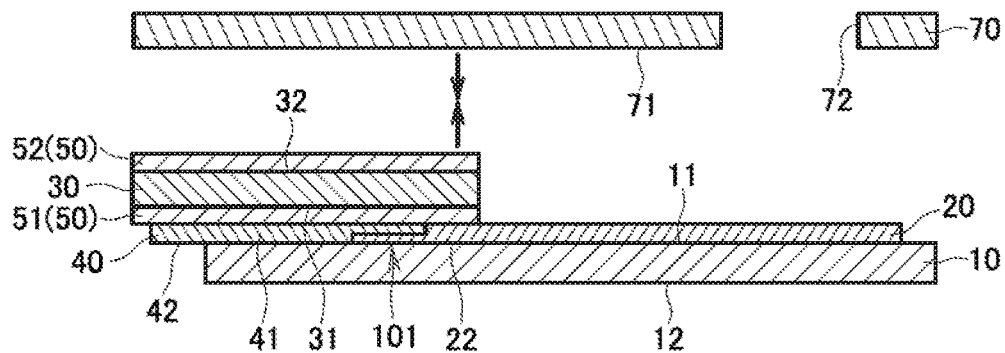
Figure 6D:
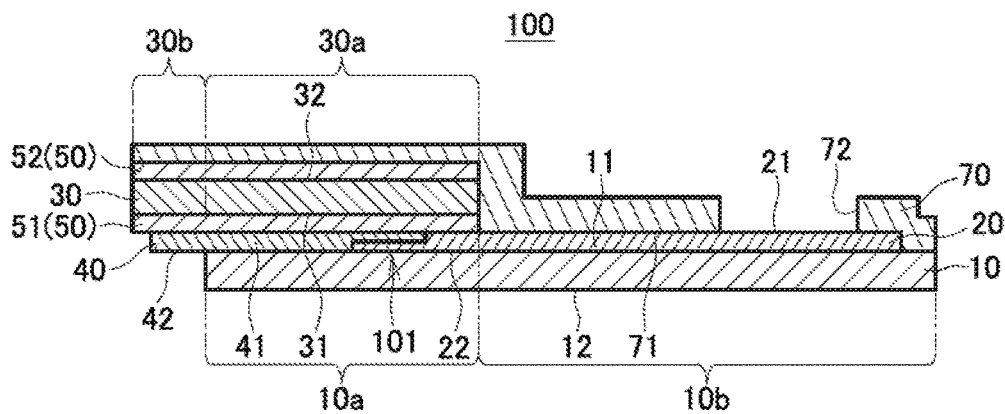

Next, the stretchable cover base 70 having the opening 72 formed therein and the layered body obtained through the step in FIG. 6B are aligned with each other and are layered, and then, these are joined with each other. That is, the layered body and the stretchable cover base 70 are thermally compressed (application of heat and pressure) to thermally fuse the stretchable cover base 70 and the second elastomer layer 52 with each other and also thermally fuse the stretchable cover base 70 and the other area 10b of the stretchable base 10 with each other (FIGS. 6C to 6D).

Through these steps, it is possible to manufacture the stretchable circuit board 100 according to the present exemplary embodiment.

Fourth Exemplary Embodiment

Next, a stretchable circuit board 100 according to a fourth exemplary embodiment will be described with reference to FIG. 7.

Figure 7:
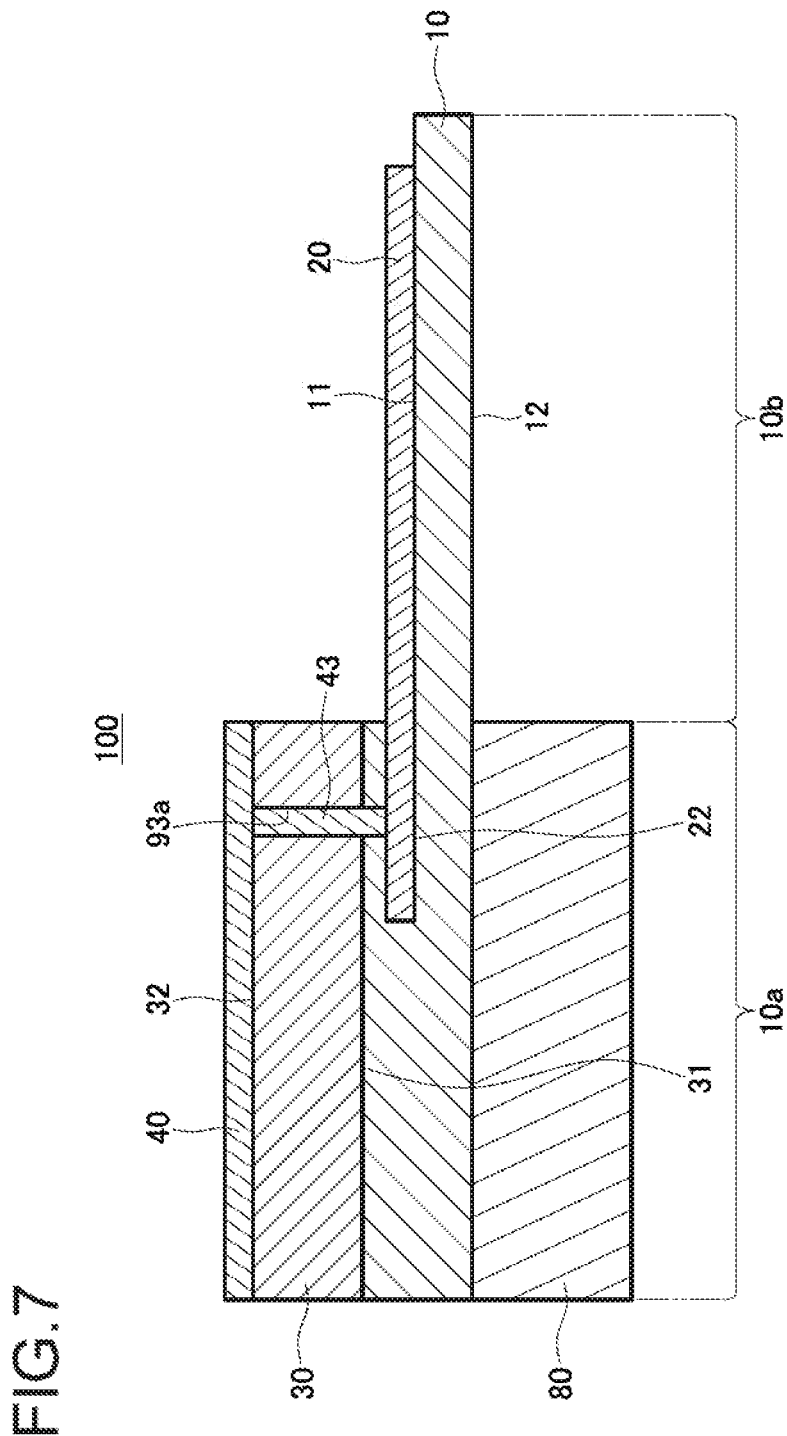
FIG. 7 is a sectional view of a cut end face of a stretchable circuit board according to a fourth exemplary embodiment.

FIG. 7 is a diagram illustrating a stretchable circuit board 100 according to a fourth exemplary embodiment, showing a cut end face obtained by cutting the stretchable circuit board 100 in the thickness direction.

In the points described below, the stretchable circuit board 100 according to the present exemplary embodiment is different from the stretchable circuit board 100 according to the first exemplary embodiment described above, while, in other points, it has a configuration similar to that of the stretchable circuit board 100 according to the first exemplary embodiment.

The stretchable circuit board 100 according to the present exemplary embodiment includes the stretchable base 10 having the stretchable wiring portion 20 formed thereon, and the reinforcement base 30 having the draw-out wiring portion 40 formed thereon, the draw-out wiring portion 40 being electrically continuous with the stretchable wiring portion 20. The reinforcement base 30 overlaps with the partial area 10a of the stretchable base 10. The other area 10b of the stretchable base 10 is exposed from the reinforcement base 30. The stretchable wiring portion 20 extends from the other area 10b over the partial area 10a. In addition, the thickness of the partial area 10a of the stretchable base 10 is greater than that of the other area 10b of the stretchable base 10.

Furthermore, the draw-out wiring portion 40 is disposed on a main surface (the second main surface 32) of the reinforcement base 30 from among the first main surface 31 and the second main surface 32 of the reinforcement base 30, this main surface being located on the side opposite to the stretchable base 10 side.

The stretchable circuit board 100 further includes a reinforcing film 80 having in-plane rigidity greater than that of the stretchable base 10. The reinforcing film 80 is disposed in the partial area 10a of the stretchable base 10 and on a main surface (the second main surface 12) from among the first main surface 11 and the second main surface 12 of the stretchable base 10, this main surface being located on the side opposite to the reinforcement base 30 side.

There is no particular limitation as to the material for the reinforcing film 80. However, it may be possible to use a synthetic resin having a low sliding resistance property, corrosion resistance, and increased strength, such as polyethylene terephthalate (PET), polyimide (PI), polyphenylene sulfide (PPS), and fluorocarbon resin. It is preferable that the thickness of the reinforcing film 80 is larger than that of the reinforcement base 30.

Furthermore, in the case of the present exemplary embodiment, the one end portion of the stretchable wiring portion 20 is buried in the stretchable base 10.

In the case of the present exemplary embodiment, in order to cause the draw-out wiring portion 40 and the stretchable wiring portion 20 to be electrically continuous with each other, a through hole 93a is formed from the reinforcement base 30 through the inside of the stretchable base 10, and a connection conductor 43 is made out of an electrically conductive material filled in the through hole 93a. Through this connection conductor 43, each of the draw-out wiring portions 40 is electrically continuous with a corresponding stretchable wiring portion 20.

Furthermore, the portion of the stretchable wiring portion 20 located on the partial area 10a of the stretchable base 10 is the buried portion 22, which is formed in a manner such that the entire periphery of this portion around the longitudinal axis thereof is wrapped by the stretchable base 10.

Here, in the case where the reinforcement base 30 is provided with a connector (not illustrated), the reinforcement base 30 largely bends and deforms when the connector is handled or is inserted/detached to a connector of an external device. In view of such a situation, the stretchable base 10 has a greater thickness in an area (that is, in the partial area 10a) where the reinforcement base 30 is disposed, and hence, when the connector largely bends and deforms, this bending is less likely to have an effect on the surface (the second main surface 12), locate on the side opposite to the reinforcement base 30 side, of the stretchable base 10. That is, even when the connector largely bends and deforms, it is possible to reduce the amount of deformation of the lower surface (the second main surface 12) of the stretchable base 10.

Thus, it is possible to prevent detachment of the reinforcing film 80 from the stretchable base 10.

Next, the method for manufacturing the stretchable circuit board according to the present exemplary embodiment will be described with reference to FIGS. 8A, 8B, 8C, 8D, and 8E.

Figure 8A:
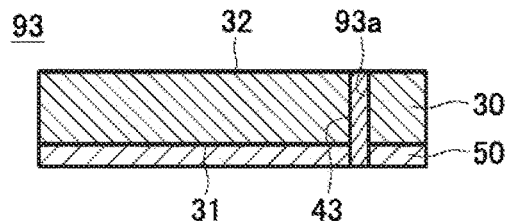
FIGS. 8A, 8B, 8C, 8D, and 8E are process diagrams each illustrating a step for manufacturing the stretchable circuit board according to the fourth exemplary embodiment.
Figure 8B:
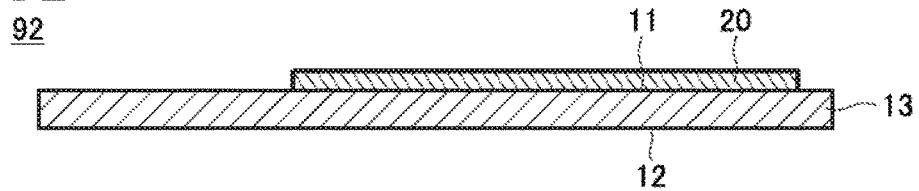

First, the first layered body 93 illustrated in FIG. 8A and the second layered body 92 illustrated in FIG. 8B are prepared.

In order to manufacture the first layered body 93, an elastomer layer 50 is first formed on the first main surface 31 of the reinforcement base 30. Next, the through hole 93a penetrating through the reinforcement base 30 and the elastomer layer 50 in the thickness direction is formed. Then, the through hole 93a is filled with an electrically conductive material to form the connection conductor 43 in the through hole 93a. Each through hole 93a is formed at a position corresponding to the one end portion of each of the stretchable wiring portions 20.

The second layered body 92 is similar to the second layered body 92 in the first exemplary embodiment. However, for the purpose of explanation, the reference character of the stretchable base that the second layered body 92 includes is a stretchable base 13 in this exemplary embodiment.

Figure 8C:
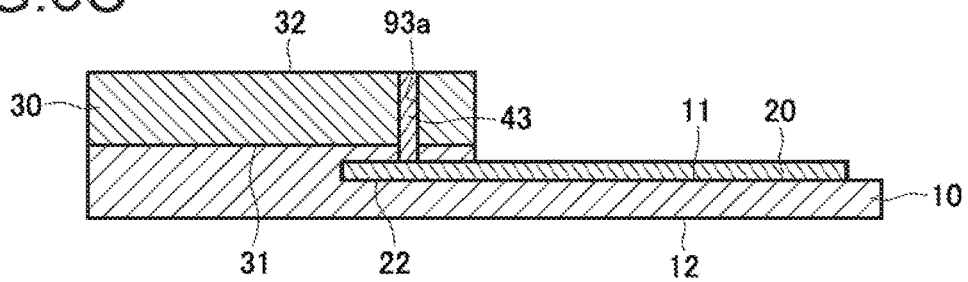

Next, the first layered body 93 and the second layered body 92 are aligned with each other and are layered, and then, these bodies are joined with each other. That is, the first layered body 93 and the second layered body 92 are thermally compressed (application of heat and pressure) to thermally fuse the elastomer layer 50 and the stretchable base 13 with each other. Through these steps, the elastomer layer 50 and the stretchable base 13 are integrally fused to form the stretchable base 10 (FIG. 8C). The stretchable base 10 partially has an increased thickness (in a left-side portion in FIG. 8C). In addition, the connection conductors 43 are each brought into contact with one end portion of a corresponding stretchable wiring portion 20, and the connection conductors 43 are each electrically continuous with the corresponding stretchable wiring portion 20.

Figure 8D:
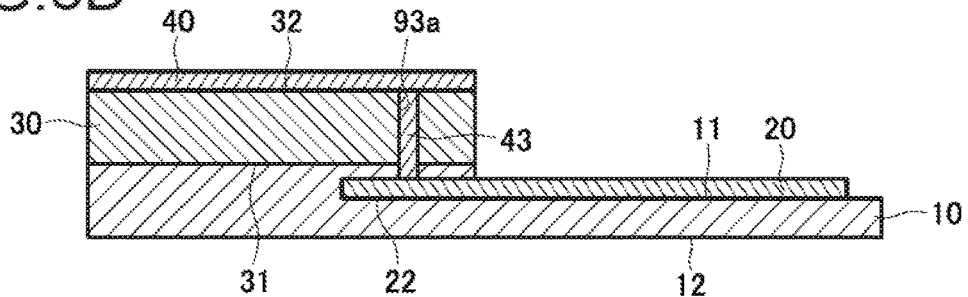

Next, the draw-out wiring portion 40 is formed on the second main surface 32 of the reinforcement base 30 (FIG. 8D). Through these steps, the draw-out wiring portions 40 are each electrically continuous with a corresponding stretchable wiring portion 20 through the connection conductor 43.

Figure 8E:
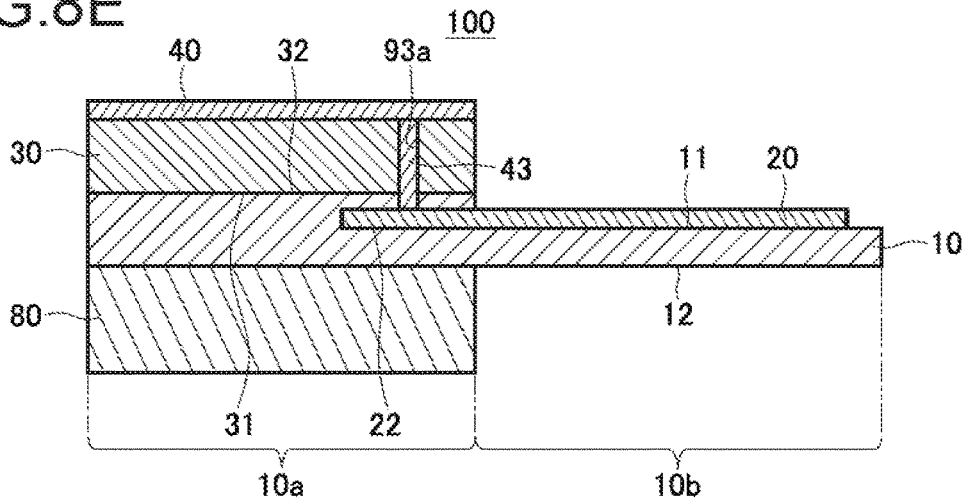

Next, the reinforcing film 80 is fixed on the first main surface 31 of the reinforcement base 30 (FIG. 8E).

Through these steps, it is possible to manufacture the stretchable circuit board 100.

The exemplary embodiments include the following technical ideas.

(1) A stretchable circuit board, including:
  a stretchable base;
  a stretchable wiring portion formed on at least one of a first main surface and a second main surface of the stretchable base;
  a reinforcement base having in-plane rigidity higher than that of the stretchable base;
  a draw-out wiring portion formed on at least one of a first main surface and a second main surface of the reinforcement base, and electrically continuous with the stretchable wiring portion; and
  an elastomer layer formed on at least one of the first main surface and the second main surface of the reinforcement base, in which
  the reinforcement base overlaps with a partial area of the stretchable base,
  an other area of the stretchable base is exposed from the reinforcement base,
  the stretchable wiring portion extends on the other area and over the partial area, and
  the elastomer layer and the stretchable base are layered and joined with each other.

(2) The stretchable circuit board according to (1), in which
  the elastomer layer lies between the draw-out wiring portion and the reinforcement base, and
  the draw-out wiring portion is in contact with one surface of the elastomer layer.

(3) The stretchable circuit board according to (2), in which
  the moisture permeability (degree of moisture permeability) of the elastomer layer is equal to or more than (1000 g/m$^2$)/24 h.

(4) The stretchable circuit board according to (2) or (3), in which
  the thickness of the elastomer layer is smaller than the thickness of the stretchable base.

(5) The stretchable circuit board according to any one of (1) to (4), in which
  the elastomer layer is formed on at least one of the first main surface and the second main surface of the reinforcement base through an easy-adhesion coating layer.

(6) The stretchable circuit board according to any one of (1) to (5), in which
the stretchable circuit board includes:
the elastomer layer formed on the first main surface of the reinforcement base;
the draw-out wiring portion formed on the first main surface of the reinforcement base through the elastomer layer;
the stretchable wiring portion formed on the first main surface of the stretchable base; and
the stretchable cover base, in which
the first main surface of the reinforcement base and the first main surface of the stretchable base are faced with each other with the elastomer layer and the draw-out wiring portion being disposed between these surfaces,
the elastomer layer and the first main surface of the stretchable base are joined with each other,
one surface of the stretchable cover base is joined with the first main surface of the stretchable base in the other area,
the stretchable cover base has an opening that partially exposes the stretchable wiring portion on the other area, and
one end portion of the stretchable cover base is disposed between the elastomer layer and the stretchable base.
(7) The stretchable circuit board according to any one of (1) to (5), in which
the stretchable circuit board includes:
a first said elastomer layer formed on the first main surface of the reinforcement base;
a second said elastomer layer formed on the second main surface of the reinforcement base;
the draw-out wiring portion formed on the first main surface of the reinforcement base through the first elastomer layer;
the stretchable wiring portion formed on the first main surface of the stretchable base; and
the stretchable cover base, in which
the first main surface of the reinforcement base and the first main surface of the stretchable base are faced with each other with the first elastomer layer and the draw-out wiring portion being disposed between these surfaces,
the first elastomer layer and the first main surface of the stretchable base are joined with each other,
one surface of the stretchable cover base is joined with the second elastomer layer and the first main surface of the stretchable base in the other area, and
the stretchable cover base has an opening that partially exposes the stretchable wiring portion on the other area.
(8) A stretchable circuit board, including:
a stretchable base having a stretchable wiring portion formed thereon; and
a reinforcement base having a draw-out wiring portion formed thereon, the draw-out wiring portion being electrically continuous with the stretchable wiring portion, in which
the reinforcement base overlaps with a partial area of the stretchable base,
an other area of the stretchable base is exposed from the reinforcement base,
the stretchable wiring portion extends from the other area over the partial area, and
the partial area of the stretchable base has a thickness greater than the thickness of the other area of the stretchable base.
(9) The stretchable circuit board according to (8), in which
the draw-out wiring portion is disposed on a main surface of the reinforcement base from among the first main surface and the second main surface of the reinforcement base, the main surface being located on a side opposite to the stretchable base side,
the stretchable circuit board further includes a reinforcement film having in-plane rigidity greater than that of the stretchable base, and
the reinforcement film is disposed on the partial area of the stretchable base and on a main surface from among the first main surface and the second main surface of the stretchable base, the main surface being located on a side opposite to the reinforcement base side.
(10) The stretchable circuit board according to (8) or (9), in which
a portion of the stretchable wiring portion located on the partial area of the stretchable base is a buried portion formed in a manner such that an entire periphery of this portion around a longitudinal axis thereof is wrapped by the stretchable base.
(11) The stretchable circuit board according to (10), in which
a connecting portion between the stretchable wiring portion and the draw-out wiring portion is wrapped by the stretchable base.
(12) A method for manufacturing a stretchable circuit board, including:
forming a draw-out wiring portion and an elastomer layer on a reinforcement base;
forming a stretchable wiring portion on a stretchable base; and
applying heat and pressure to the reinforcement base and the stretchable base to thermally fuse the elastomer layer and the stretchable base.
(13) The method for manufacturing a stretchable circuit board according to (12), in which
said forming the draw-out wiring portion and the elastomer layer on the reinforcement base includes:
forming the elastomer layer, by applying a coating agent obtained by dispersing a thermoplastic elastomer in a solvent on the reinforcement base, and volatilizing the solvent to dry the coating agent; and
forming the draw-out wiring portion on the elastomer layer.

The present application claims priority based on Japanese Patent Application No. 2016-83237 filed on Apr. 18, 2016, the disclosures of which are incorporated herein in their entirety.

The invention claimed is:
1. A stretchable circuit board, comprising:
a stretchable base;
a stretchable wiring portion formed on at least one of a first main surface and a second main surface of the stretchable base;
a reinforcement base having in-plane rigidity higher than that of the stretchable base;
a conductor portion formed on at least one of a first main surface and a second main surface of the reinforcement base, and electrically continuous with the stretchable wiring portion; and
an elastomer layer formed on at least one of the first main surface and the second main surface of the reinforcement base, wherein
the reinforcement base overlaps with a partial area of the stretchable base,
an other area of the stretchable base is exposed from the reinforcement base,
the stretchable wiring portion extends on the other area and over the partial area, the elastomer layer and the stretchable base are layered and joined with each other, the elastomer layer lies between the conductor portion and the reinforcement base, the conductor portion is in contact with one surface of the elastomer layer, the elastomer layer has an electrically insulating property, and the elastomer layer entirely covers the first main surface of the reinforcement base.

2. The stretchable circuit board according to claim 1, wherein the moisture permeability of the elastomer layer is equal to or more than $(1000 \text{ g/m}^2)/24 \text{ h}$.

3. The stretchable circuit board according to claim 1, wherein the thickness of the elastomer layer is smaller than the thickness of the stretchable base.

4. The stretchable circuit board according to claim 1, wherein the elastomer layer is formed on at least one of the first main surface and the second main surface of the reinforcement base through an easy-adhesion coating layer.

5. The stretchable circuit board according to claim 1, wherein the stretchable circuit board comprises:
the elastomer layer formed on the first main surface of the reinforcement base;
the conductor portion formed on the first main surface of the reinforcement base through the elastomer layer;
the stretchable wiring portion formed on the first main surface of the stretchable base; and
a stretchable cover base, wherein
the first main surface of the reinforcement base and the first main surface of the stretchable base are faced with each other with the elastomer layer and the conductor portion being disposed between these surfaces,
the elastomer layer and the first main surface of the stretchable base are joined with each other,
one surface of the stretchable cover base is joined with the first main surface of the stretchable base in the other area,
the stretchable cover base has an opening that partially exposes the stretchable wiring portion on the other area, and
one end portion of the stretchable cover base is disposed between the elastomer layer and the stretchable base.

6. The stretchable circuit board according to claim 1, wherein the stretchable circuit board comprises:
a first said elastomer layer formed on the first main surface of the reinforcement base;
a second said elastomer layer formed on the second main surface of the reinforcement base;
the conductor portion formed on the first main surface of the reinforcement base through the first elastomer layer;
the stretchable wiring portion formed on the first main surface of the stretchable base; and
a stretchable cover base, wherein
the first main surface of the reinforcement base and the first main surface of the stretchable base are faced with each other with the first elastomer layer and the conductor portion being disposed between these surfaces,
the first elastomer layer and the first main surface of the stretchable base are joined with each other,
one surface of the stretchable cover base is joined with the second elastomer layer and the first main surface of the stretchable base in the other area, and
the stretchable cover base has an opening that partially exposes the stretchable wiring portion on the other area.

7. A stretchable circuit board, comprising:
a stretchable base having a stretchable wiring portion formed thereon; and
a reinforcement base having a conductor portion formed thereon, the conductor portion being electrically continuous with the stretchable wiring portion, wherein
the reinforcement base overlaps with a partial area of the stretchable base,
an other area of the stretchable base is exposed from the reinforcement base,
the stretchable wiring portion extends from the other area over the partial area,
the partial area of the stretchable base has a thickness greater than the thickness of the other area of the stretchable base such that the stretchable base is raised toward the reinforcement base in the partial area,
the conductor portion is formed on a first surface of the reinforcement base that is opposite to a second surface of the reinforcement base having formed the stretchable base,
a portion of the stretchable base of the partial area is interposed between the reinforcement base and the stretchable wiring portion.

8. The stretchable circuit board according to claim 7, wherein the conductor portion is disposed on a main surface of the reinforcement base from among the first main surface and the second main surface of the reinforcement base, the main surface being located on a side opposite to the stretchable base side,
the stretchable circuit board further comprises a reinforcement film having in-plane rigidity greater than that of the stretchable base, and
the reinforcement film is disposed on the partial area of the stretchable base and on a main surface from among the first main surface and the second main surface of the stretchable base, the main surface being located on a side opposite to the reinforcement base side.

9. The stretchable circuit board according to claim 7, wherein a portion of the stretchable wiring portion located on the partial area of the stretchable base is a buried portion formed in a manner such that an entire periphery of this portion around a longitudinal axis thereof is wrapped by the stretchable base.

10. The stretchable circuit board according to claim 9, wherein a connecting portion between the stretchable wiring portion and the conductor portion is wrapped by the stretchable base.

11. The stretchable circuit board according to claim 1, wherein the thickness of the reinforcement base is greater than that of the stretchable base.

12. The stretchable circuit board according to claim 4, wherein the easy-adhesion coating layer has moisture permeability.

13. The stretchable circuit board according to claim 6, wherein the second elastomer layer entirely covers the second main surface of the reinforcement base.

14. The stretchable circuit board according to claim 7, wherein the stretchable base is integrally fused to each other at both front and back sides of a part of the conductor portion arranged in the partial area.

15. A stretchable circuit board, comprising:
- a stretchable base;
- a stretchable wiring portion formed on at least one of a first main surface and a second main surface of the stretchable base;
- a reinforcement base having in-plane rigidity higher than that of the stretchable base;
- a conductor portion formed on at least one of a first main surface and a second main surface of the reinforcement base, and electrically continuous with the stretchable wiring portion; and
- an elastomer layer formed on at least one of the first main surface and the second main surface of the reinforcement base, wherein
- the reinforcement base overlaps with a partial area of the stretchable base,
- an other area of the stretchable base is exposed from the reinforcement base,
- the stretchable wiring portion extends on the other area and over the partial area, and
- the elastomer layer and the stretchable base are layered and joined with each other,
- the elastomer layer lies between the conductor portion and the reinforcement base,
- the conductor portion is in contact with one surface of the elastomer layer, and
- the thickness of the reinforcement base is greater than that of the stretchable base.

\* \* \* \* \*